(12) United States Patent
Kalyanamahadevi Gopalan Jawarlal et al.

(10) Patent No.: US 11,728,792 B2
(45) Date of Patent: Aug. 15, 2023

(54) APPARATUS AND METHOD FOR IN-PHASE AND QUADRATURE PHASE (IQ) GENERATION

(71) Applicant: SAMSUNG ELECTRONICS CO., LTD., Suwon-si (KR)

(72) Inventors: Vishnu Kalyanamahadevi Gopalan Jawarlal, Bangalore (IN); Sumanth Chakkirala, Bangalore (IN)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 17/706,191

(22) Filed: Mar. 28, 2022

(65) Prior Publication Data

US 2023/0117732 A1 Apr. 20, 2023

(30) Foreign Application Priority Data

Oct. 19, 2021 (IN) .............................. 202141047428

(51) Int. Cl.
*H03K 3/017* (2006.01)
(52) U.S. Cl.
CPC .................................. *H03K 3/017* (2013.01)
(58) Field of Classification Search
CPC ..................................................... H03K 3/017
See application file for complete search history.

(56) References Cited

U.S. PATENT DOCUMENTS

| | | | |
|---|---|---|---|
| 6,785,528 B2 | 8/2004 | Carpineto | |
| 9,385,651 B2 | 7/2016 | Zong et al. | |
| 9,559,792 B1 * | 1/2017 | Amir-Aslanzadeh | H04B 17/12 |
| 11,271,574 B1 * | 3/2022 | O'Sullivan | H04B 1/06 |
| 2007/0259640 A1 * | 11/2007 | Pandey | H04L 27/2626 455/260 |
| 2010/0040184 A1 * | 2/2010 | Haralabidis | H04B 15/06 375/373 |

(Continued)

FOREIGN PATENT DOCUMENTS

| | | |
|---|---|---|
| WO | 2017039829 A1 | 3/2017 |
| WO | 2018121187 A1 | 7/2018 |

OTHER PUBLICATIONS

Annamaria Tedesco et al., "A 11 15 Ghz CMOS ÷ 2 Frequency Divider for Broad Band I/Q Generation," Dipartimento Di Elettronica Ed Informazione—Politecnico Di Milano, Jul. 25, 2014, P.Za Leonardo Da Vinci 32, I-20133 Milano, Italy.

(Continued)

*Primary Examiner* — Sibin Chen
(74) *Attorney, Agent, or Firm* — Fish & Richardson P.C.

(57) ABSTRACT

An apparatus for in-phase and quadrature phase ("IQ") generation comprises a CMOS clock distributor for providing a clock input. A first IQ divider circuit is configured for receiving the clock input and dividing the clock input into in-phase and quadrature phase (IQ) output. A clock processing circuit is configured for processing the clock input. A second IQ divider circuit is configured for receiving the processed clock input and dividing the processed clock input into in-phase and quadrature phase (IQ) output. A multiplexer circuit is coupled to the first IQ divider circuit and the second IQ divider circuit for selecting the IQ output from the first IQ divider circuit or the second IQ divider circuit.

20 Claims, 28 Drawing Sheets

(56) References Cited

U.S. PATENT DOCUMENTS

2016/0164558 A1* 6/2016 Elzeftawi ............... H03L 7/099
                                                    455/192.1
2022/0091251 A1* 3/2022 Heller .................... G01S 13/34

OTHER PUBLICATIONS

Ullas Singh et al., "Dynamics of High-Frequency CMOS Dividers," Dept. of Electrical and Computer Engineering, V-421-V-424 University of California Irvine, CA, 92697, USA.

Hui Zhang et al., "Start-Up Analysis for Differential Ring Oscillator With Even Number of Stages," Institute of Electronics, Chinese Academy of Sciences (CAS), 636-639, 2010 IEEE Asia Pacific Conference on Circuits and Systems, 100049 Bejing, China.

Chao Yan et al., "Verifying Global Start-Up for a Mobius Ring-Oscillator," Formal Methods in System Design Manuscript, Jun. 13, 2013.

* cited by examiner

Fig. 6

APPARATUS AND METHOD FOR IN-PHASE AND QUADRATURE PHASE (IQ) GENERATION

CROSS-REFERENCE TO RELATED APPLICATION

This U.S. nonprovisional patent application is based on and claims priority under 35 U.S.C. § 119 to Indian Patent Application No. 202141047428, filed on Oct. 19, 2021, in the Indian Intellectual Property Office, the disclosure of which is incorporated by reference herein in its entirety.

FIELD

The present disclosure relates to oscillators, and more specifically, relates to IQ phase generation.

BACKGROUND

A frequency divider or IQ divider (in-phase and quadrature-phase divider), also called a clock divider or scaler or pre-scaler, is a circuit that takes an input signal of one frequency and generates an output signal of another frequency. In an example, phase-locked loop frequency synthesizers make use of frequency dividers or IQ dividers to generate a frequency that is a multiple of a reference frequency. Frequency dividers can be implemented for both analog and digital applications.

IQ dividers are suited for broadband IQ phase generation since they consume low power, do not require a large area, and do not require calibration. However, IQ dividers suffer from issues of self-oscillation and latch-up. Self-oscillation occurs when a periodic motion is generated and maintained by a source of power that lacks a corresponding periodicity, and a result is a negative damping which feeds energy into vibration which is characteristic of the self-oscillation. Latch-up is the unintended creation of a low-impedance path between power supply rails and is a type of short circuit.

In an example, CML IQ dividers (current mode logic IQ dividers) and CMOS IQ dividers (complementary metal-oxide semiconductor IQ dividers) in an IQ divider circuit are suited for high-frequency operations and low-frequency operations, respectively. Input CMOS clock distribution consumes 4 times less power than CML to meet the same phase noise. However, using an input CMOS clock for distribution is suitable for driving the CMOS IQ divider but is not adequate for driving the CML IQ divider. Therefore, a CML input clock is required for distribution in a conventional IQ divider circuit with a CML IQ divider and a CMOS IQ divider.

An example representative of conventional IQ divider circuits, such as PPF IQ dividers and CML IQ dividers, is depicted in FIG. 1. These conventional divider circuits are multiplexed to generate broadband output. Only low distortion sine wave inputs are given as the input clock to the CML IQ divider and the CMOS IQ divider in these conventional divider circuits.

Other conventional dividers, such as injection locking frequency dividers, require calibration for acceptable quadrature error. Moreover, phase accuracy is substantially compromised and power consumption is high for these types of conventional dividers.

Yet other conventional dividers comprise a polyphase filter and a CML IQ divider multiplexed to generate broadband IQ phase output using a CML clock for distribution instead of a CMOS clock for distribution. The polyphase filter and CML IQ divider are used at low frequencies and high frequencies, respectively. Since CML clock distribution is used, power consumption does not scale with frequency. Higher power is required for a CML clock used for distribution to meet the same phase noise as when a CMOS clock is used for distribution. Substantial constraints on input clock distortion remain since sine wave is required for the polyphase filter and low swing is required for the CML IQ divider.

Overall, the state-of-the-art frequency dividers mandatorily require a CML input clock, encounter self-oscillation issues, face latch-up problems, exhibit poor power supply noise rejection, and undergo high power consumption at low frequencies.

SUMMARY

This summary is provided to introduce a selection of concepts, in a simplified format, that are further described in the detailed description of the present disclosure. This summary is not limited to key or essential inventive concepts described herein, and is not intended for determining the scope of any inventive concept described herein.

According to an aspect of the present disclosure, an apparatus for in-phase and quadrature phase ("IQ") generation comprises a CMOS clock distributor for providing a clock input. A first IQ divider circuit is configured for receiving the clock input and dividing the clock input into in-phase and quadrature phase (IQ) output. A clock processing circuit is configured for processing the clock input. A second IQ divider circuit is configured for receiving the processed clock input and dividing the processed clock input into in-phase and quadrature phase (IQ) output. A multiplexer circuit is coupled to the first IQ divider circuit and the second IQ divider circuit for selecting the IQ output from the first IQ divider circuit or the second IQ divider circuit.

According to another aspect of the present disclosure, a method for in-phase and quadrature phase ("IQ") generation includes providing a clock input by a CMOS clock distributor for receiving the clock input by a first IQ divider circuit configured for dividing the clock input into in-phase and quadrature phase (IQ) output. The clock input is processed by a clock processing circuit. The processed clock input is received by a second IQ divider circuit for dividing the processed clock input into in-phase and quadrature phase (IQ) output. The IQ output is selected from the first IQ divider circuit or the second IQ divider circuit through a multiplexer circuit coupled to the first IQ divider circuit and the second IQ divider circuit.

The solutions described herein may combine the advantages of both CML dividers and CMOS dividers. A novel input clock shaping circuit enables using a CMOS input clock for both the CMOS IQ divider and the CML IQ divider and reduces the power consumption of the CML divider by 30%. This also enables at least 4 times power reduction in the input clock distribution. The clock shaper also facilitates desensitizing the CML IQ divider to input offsets and low-frequency noise, improving IQ skew by 40%. The clock shaper attenuates the input clock's duty cycle distortion helping remedy the self-oscillation issue described above.

In addition, the issue of self-oscillation is remedied across all input frequencies by controlling the input clock amplitude and slope and duty cycle. The issue of latch-up is remedied by using an initialization-based solution To further clarify the advantages and features of the teachings herein, a more particular description will be rendered by reference to specific embodiments thereof, which are illustrated in the appended drawings. It is to be appreciated that these drawings depict only typical embodiments of concepts described herein and are therefore not to be considered limiting in scope. The concepts described herein will be explained with additional specificity and detail with respect to the accompanying drawings.

BRIEF DESCRIPTION OF THE DRAWINGS

These and other features, aspects, and advantages of the teachings of the present disclosure will become better understood when the following detailed description is read with reference to the accompanying drawings in which like characters represent like parts throughout the drawings, wherein:

FIG. 6 illustrates CMOS IQ skew vs CML IQ skew;

Figure 1:
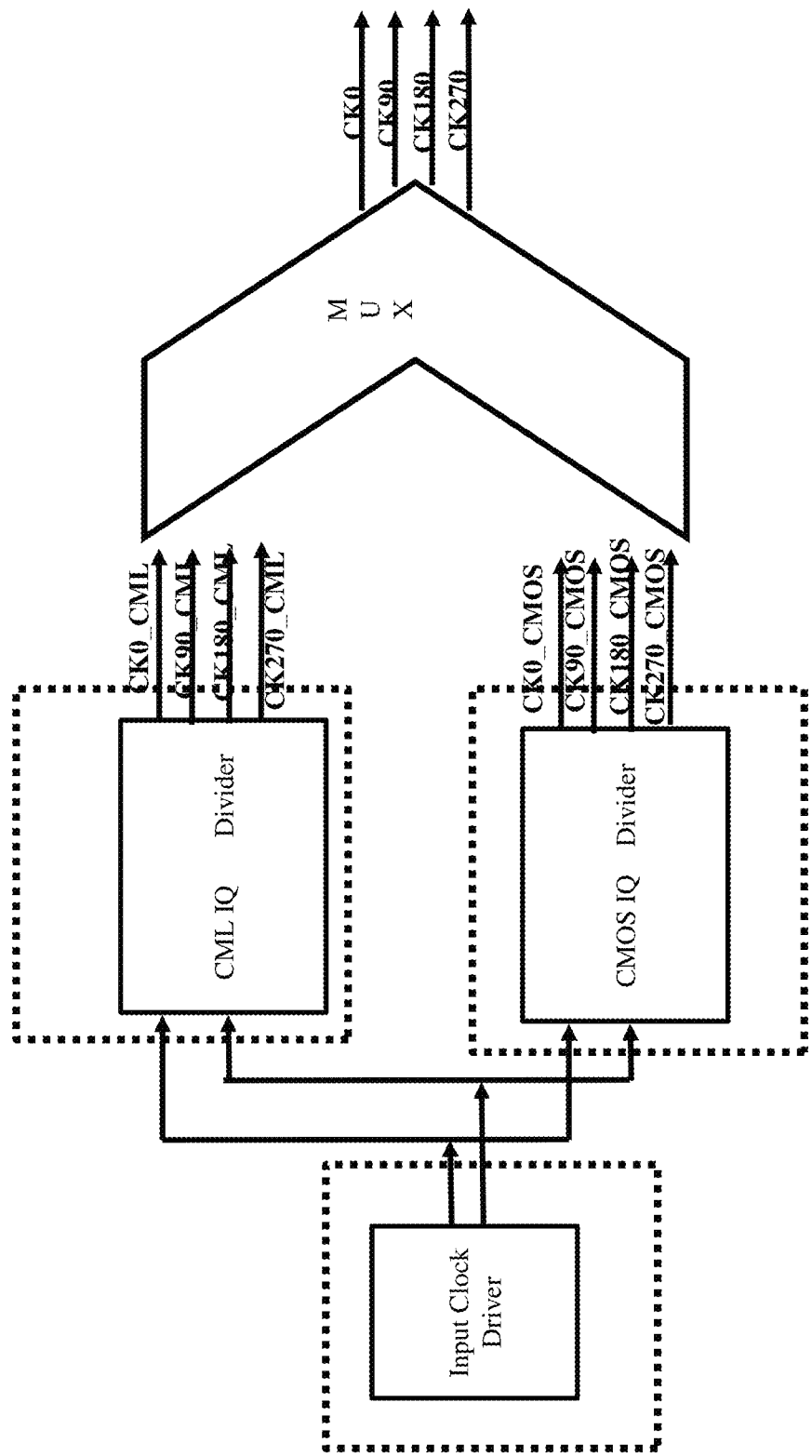
FIG. 1 illustrates a known divider circuit.

Further, skilled artisans will appreciate that elements in the drawings are illustrated for simplicity and may not have been necessarily been drawn to scale. For example, the flow charts illustrate the method in terms of the most prominent steps involved to help to improve understanding of aspects of the teachings of the present disclosure. Furthermore, in terms of the construction of the device, one or more components of the device may have been represented in the drawings by conventional symbols, and the drawings may show only those specific details that are pertinent to understanding the embodiments of the present disclosure so as not to obscure the drawings with details that will be readily apparent to those of ordinary skill in the art having benefit of the description herein.

DETAILED DESCRIPTION OF FIGURES

For the purpose of promoting an understanding of the principles described herein, reference will now be made to the embodiment illustrated in the drawings and specific language will be used to describe the same. It will nevertheless be understood that no limitation of the scope of any inventive concept described herein is thereby intended, such alterations and further modifications in the illustrated system, and such further applications of the principles of the teachings described herein as illustrated therein being contemplated as would normally occur to one skilled in the art to which the present disclosure relates.

It will be understood by those skilled in the art that the foregoing general description and the following detailed description are explanatory of the teachings herein and are not intended to be restrictive thereof.

Reference throughout this specification to "an aspect", "another aspect" or similar language means that a particular feature, structure, or characteristic described in connection with the embodiment is included in at least one embodiment of the present disclosure. Thus, appearances of the phrase "in an embodiment", "in another embodiment" and similar language throughout this specification may, but do not necessarily, all refer to the same embodiment.

The terms "comprises", "comprising", or any other variations thereof, are intended to cover a non-exclusive inclusion, such that a process or method that comprises a list of steps does not include only those steps but may include other steps not expressly listed or inherent to such process or method. Similarly, one or more devices or sub-systems or elements or structures or components proceeded by "comprises . . . a" does not, without more constraints, preclude the existence of other devices or other sub-systems or other elements or other structures or other components or additional devices or additional sub-systems or additional elements or additional structures or additional components.

Unless otherwise defined, all technical and scientific terms used herein have the same meaning as commonly understood by one of ordinary skill in the art(s) to which the teachings herein belong. The system, methods, and examples provided herein are illustrative only and not intended to be limiting.

Embodiments of the present disclosure will be described below in detail with reference to the accompanying drawings.

Figure 2:
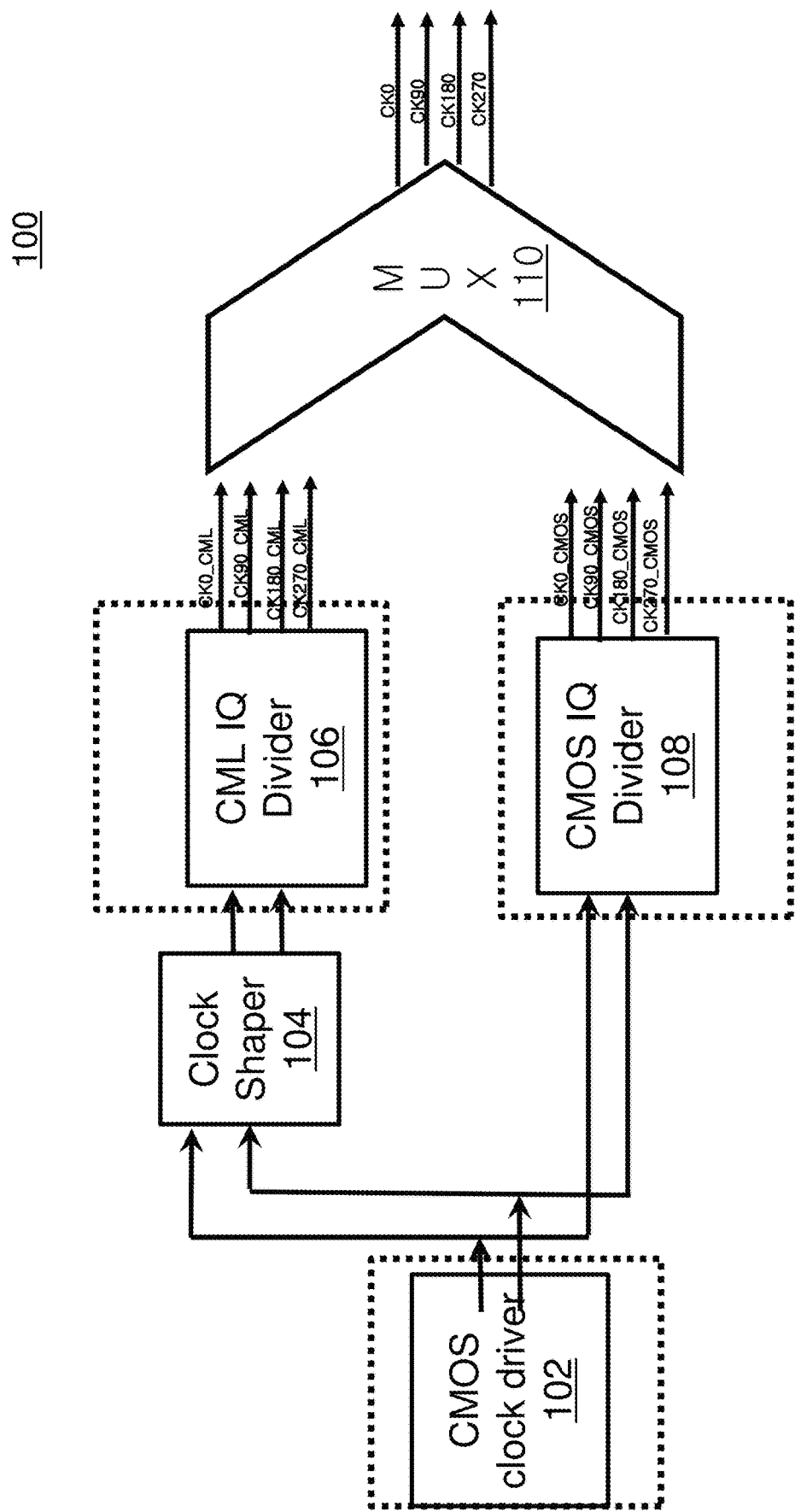
FIG. 2 illustrates an apparatus for in-phase and quadrature phase ("IQ") generation in accordance with an embodiment of the present disclosure.

FIG. 2 illustrates an apparatus for in-phase and quadrature phase ("IQ") generation. The apparatus 100 comprises a CMOS clock distributor 102 for providing a clock input. A first IQ divider circuit 108 is configured for receiving the clock input and dividing the clock input into in-phase and quadrature phase (IQ) output. The first IQ divider circuit 108 comprises a CMOS IQ divider circuit. The first IQ divider circuit 108 is defined by the CMOS clock divider and is configured for initializing outputs of latch at an operating point defined by half of a supply voltage VDD.

A clock processing circuit 104 is provided for processing the clock input. A second IQ divider circuit 106 is configured for receiving the processed clock input from the clock processing circuit 104 and dividing the processed clock input into in-phase and quadrature phase (IQ) output. The second IQ divider circuit 106 in FIG. 2 comprises a CML IQ divider. In an implementation, the clock processing circuit 104 corresponds to a clock shaper circuit configured to convert the clock input into a low swing sine wave for operation of the CML IQ divider as the second IQ divider circuit 106. The clock shaper circuit as the clock processing circuit 104 is defined by a discharge time constant higher than a frequency of the clock input, and an input clock amplitude set higher than a threshold. The slope of the clock input is controlled at a time period approximately equal to a detected self-oscillation time period within the second IQ divider. A duty cycle distortion is attenuated within the clock input. The clock shaper circuit as the clock processing circuit 104 implements a duty cycle correction using a bandpass filter, wherein an attenuation corner frequency of the bandpass filter is based on the frequency of the input clock. The bandpass filtering is defined by translation of an input clock duty cycle of 25% to 75% to 40% to 60% at the output for removal of a second or higher order harmonic.

Further, the apparatus 100 comprises a multiplexer circuit 110 coupled to the first IQ divider circuit 108 and the second IQ divider circuit 106 for selecting the IQ output from the first IQ divider circuit 108 or the second IQ divider circuit 106. The multiplexer circuit 110 is configured for selecting the IQ output based on criteria defined by a high-frequency operation and a low-frequency operation.

The clock shaping technique described herein reduces the power consumption by 30% and input clock distribution power by 4×. Issues of latch-up and self-oscillation are remedied. The solution(s) described herein meet the 2× better power supply noise rejection at the highest frequency of operation compared to a CMOS IQ dividers and 40% better IQ skew numbers at the highest frequency of operation compared to CMOS IQ dividers. The solution(s) described herein meet 10× lower power at 10× lower input clock frequency and 100× lower power at 100× lower input clock frequency compared to the CML IQ dividers. In an example, for a 2-lane MPHY solution, 10% power reduction is executed for the entire PHY.

Figure 3:
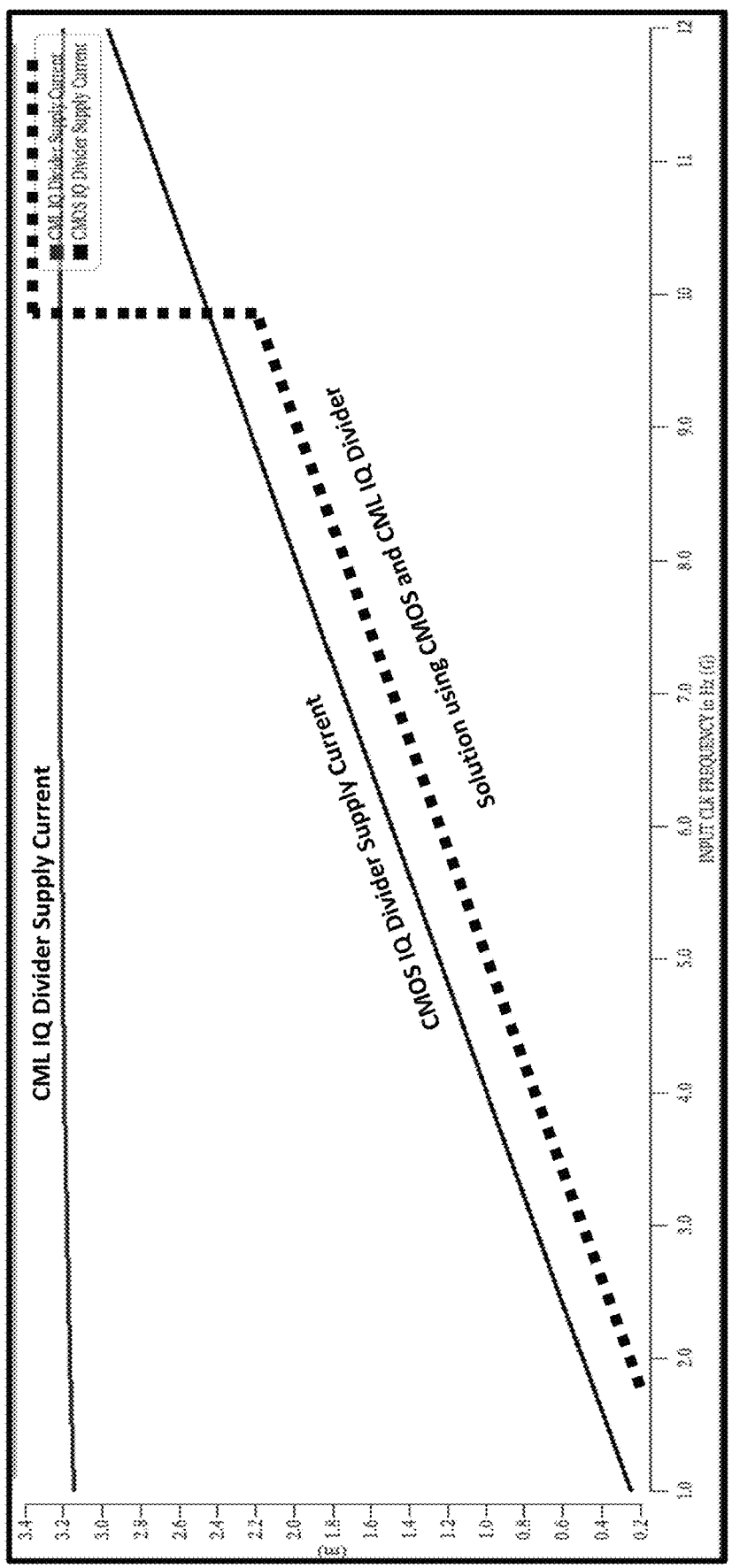
FIG. 3 illustrates power-consumption variation with respect to a CML IQ divider vs a CMOS IQ divider.

FIG. 3 illustrates power-consumption variation with respect to a CML IQ divider vs a CMOS IQ divider. The supply current of a CML divider and of a CMOS IQ divider is shown for a given frequency range in FIG. 3. Using a CML IQ divider for low-frequency operation, for example, 1 GHz, is 10× higher power than using a CMOS IQ divider for the low-frequency operation. According to an aspect of the present disclosure, a CMOS IQ divider is used at low frequencies for low power operation and the CML IQ divider is used for high-frequency operation where there is a tighter requirement on power supply noise rejection and IQ skew performance.

Figure 4:
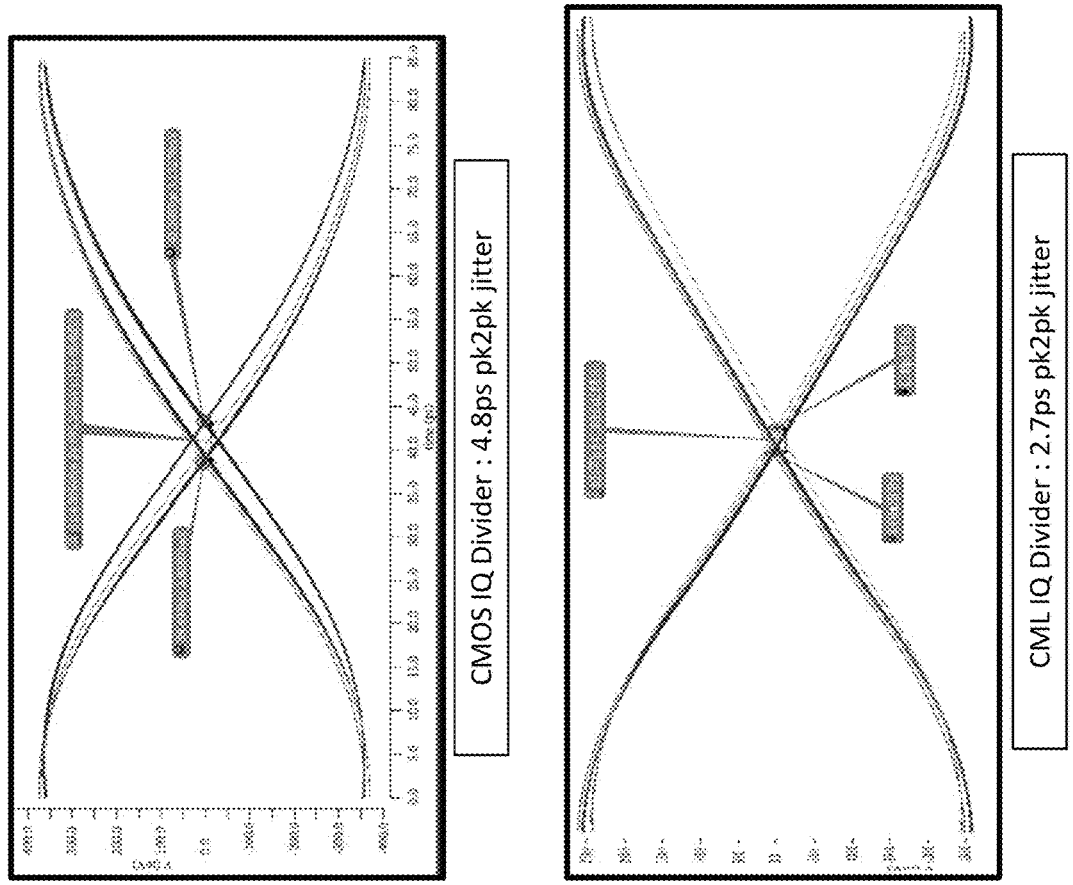
FIG. 4 illustrates a supply sensitivity comparison with respect to a CMOS IQ divider and a CML Divider.

FIG. 4 illustrates a supply sensitivity comparison with respect to a CMOS divider and a CML divider. The comparison in FIG. 4 reflects a 12 GHz input clock frequency and a clock eye diagram with 10 mV pk2pk supply noise. The result for the CMOS IQ divider illustrates a window of approximately 4.8ps pk2pk jitter and the result for the CML IQ divider illustrates a window of approximately 2.7ps pk2pk jitter, thereby referring 2X better power supply noise rejection in the CML divider.

Figure 5:
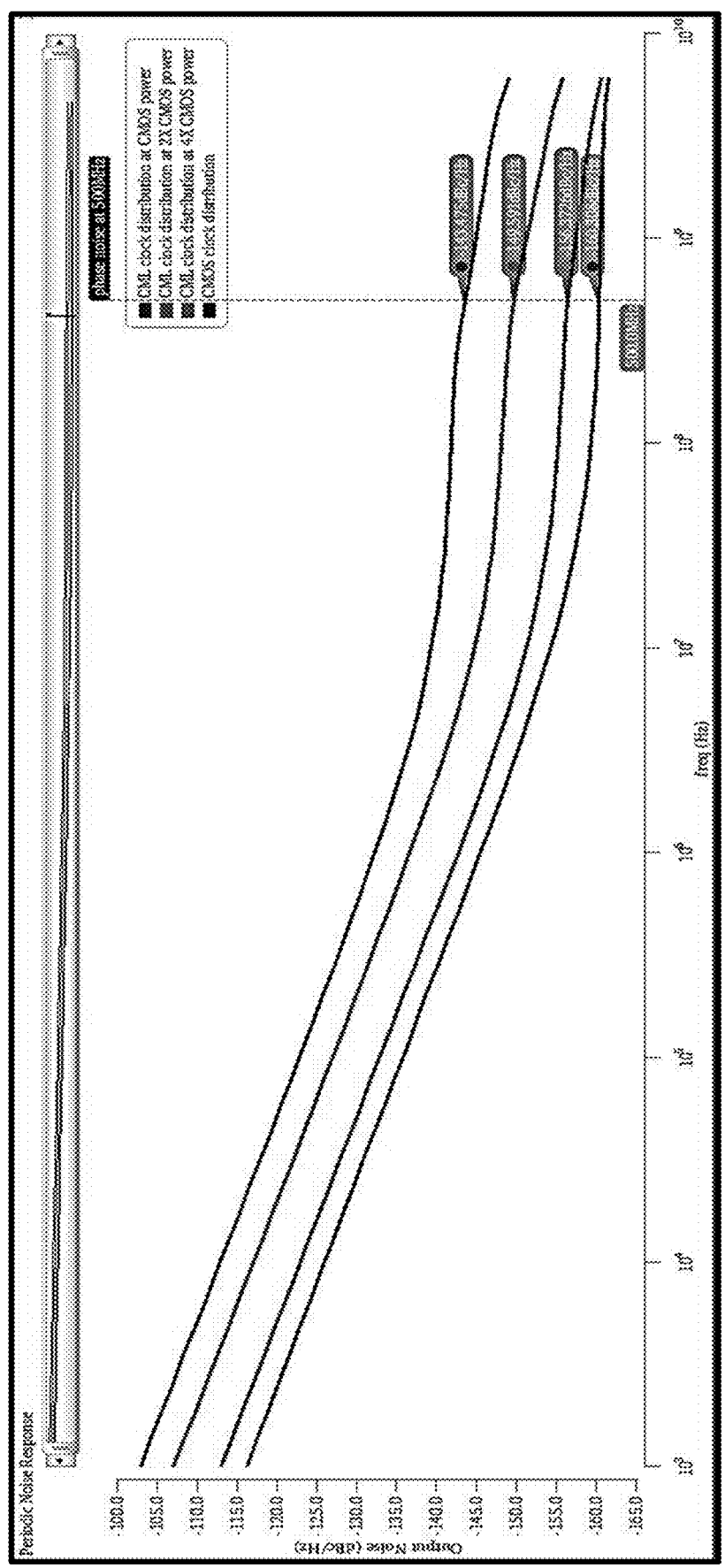
FIG. 5 illustrates CMOS clock distribution vs CML clock distribution with respect to phase noise.

FIG. 5 illustrates CMOS clock distribution vs CML clock distribution with respect to phase noise. For a given output cap load of 100 fF and single ended output clocks (with respect to ground) designed to meet the same phase noise at 12 GHz, CMOS clock distribution needs approximately 4× lower power than CML clock distribution. When supporting a limited frequency range, CML clock distribution with tuned circuits are useful.

Figure 6:
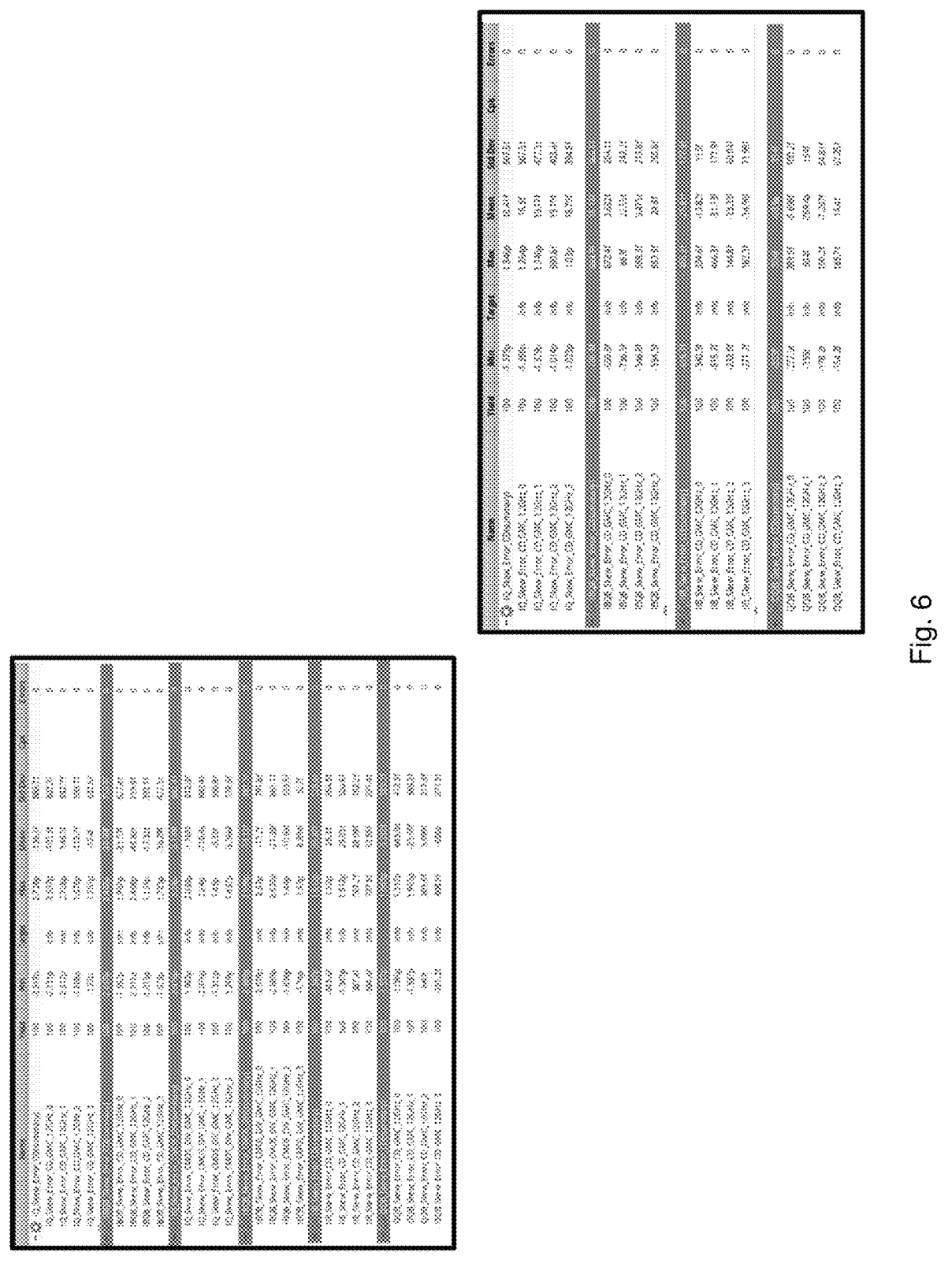

FIG. 6 illustrates CMOS IQ skew vs CML IQ skew due to random mismatch (3-sigma), wherein the CMOS IQ divider is associated with 2.5ps and the CML IQ divider is associated with 1.5 ps.

Figure 7:
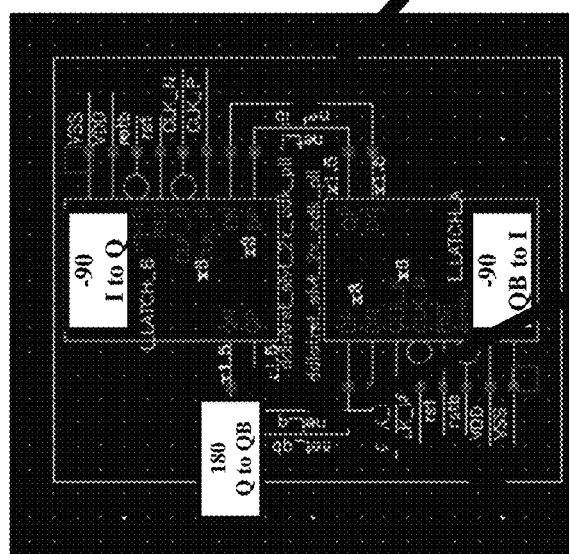
FIG. 7 illustrates IQ connections with respect to a CMOS divider.
Figure 7:
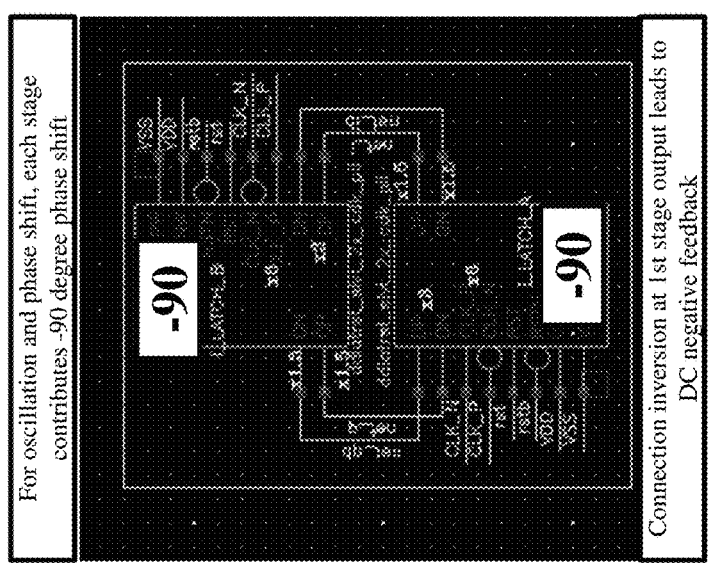

FIG. 7 illustrates IQ connections with respect to a CMOS divider. For oscillation and phase shift, each stage contributes a −90 degree phase shift. The CML IQ divider skew is also better due to low-frequency noise rejection of the clock shaper.

Figure 8:
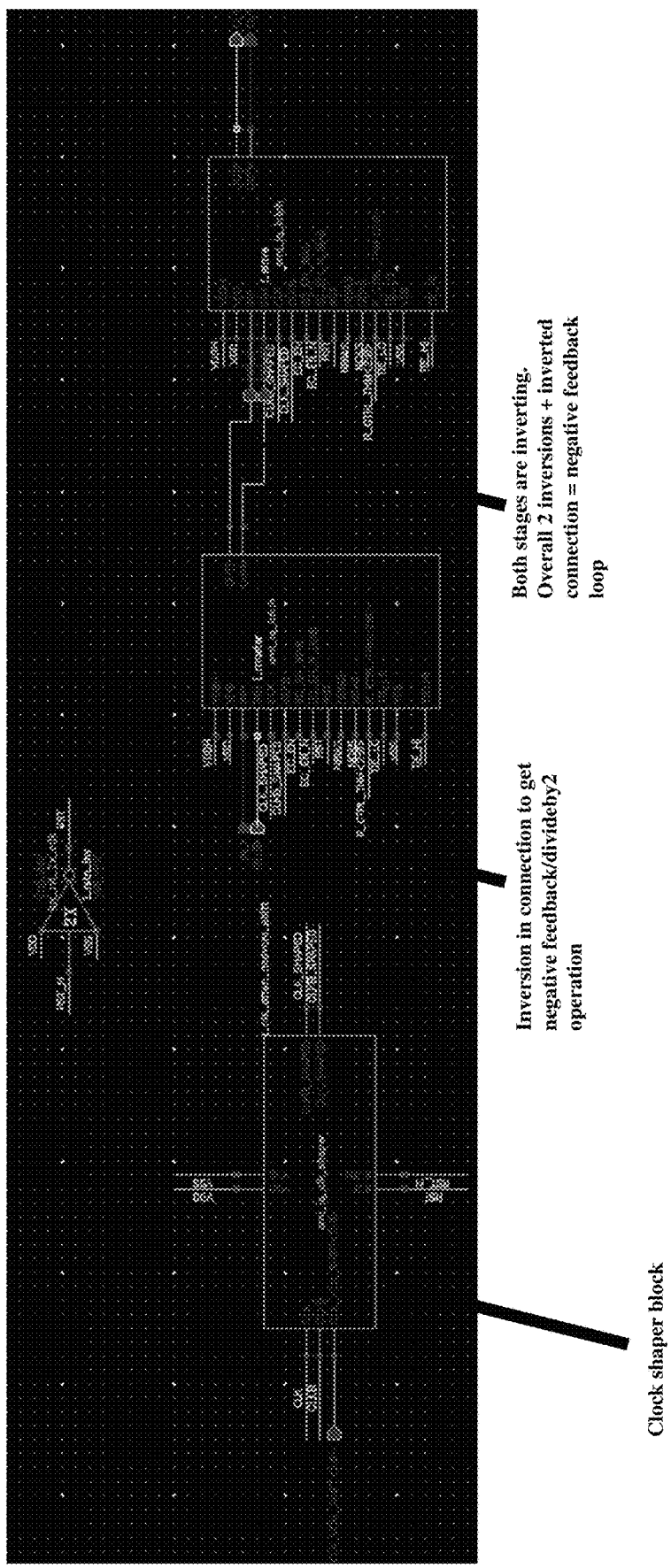
FIG. 8 illustrates a CML IQ divider.

FIG. 8 illustrates a CML IQ divider. Inversion in connection is implemented to obtain negative feedback/divide by two operation. Both stages are inverting. Overall, two inversions and an inverted connection are implemented to achieve a negative feedback loop.

Figure 9A:
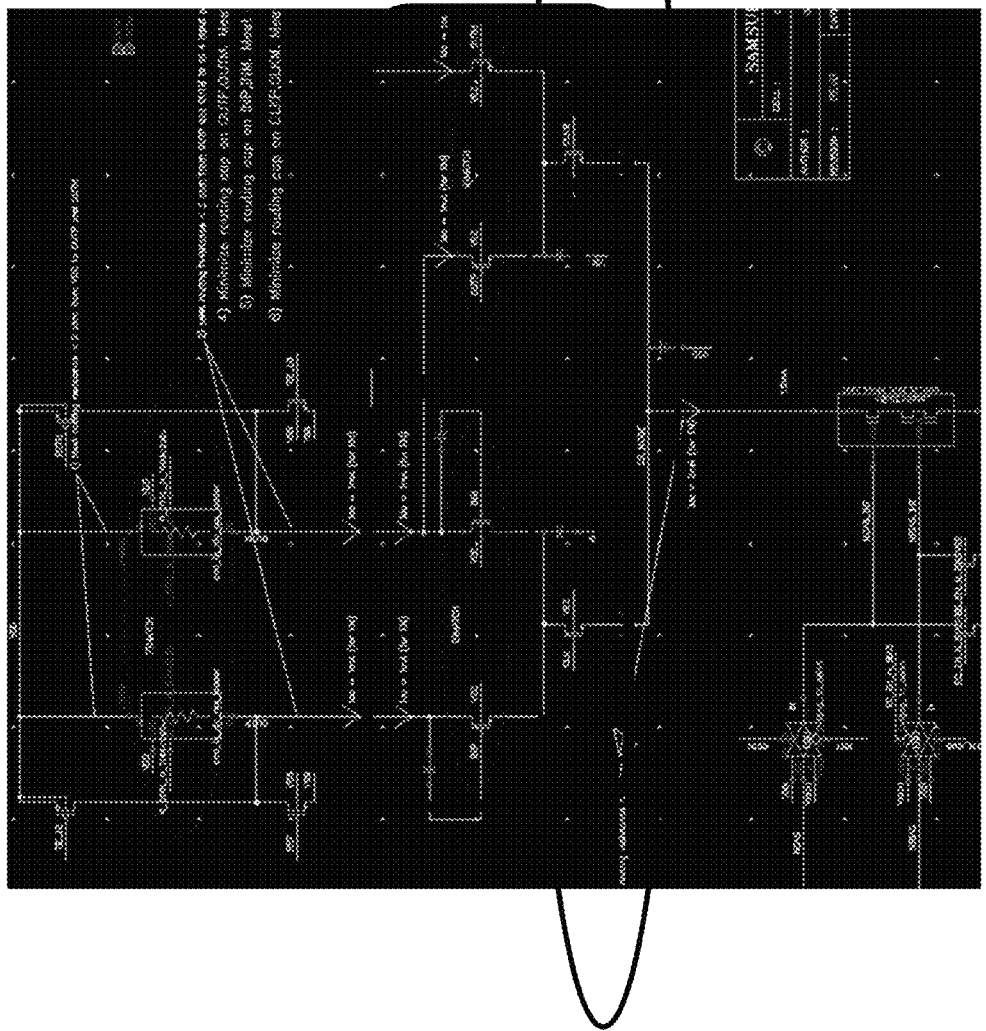
FIG. 9a and FIG. 9b illustrate CML IQ latch.
Figure 9B:
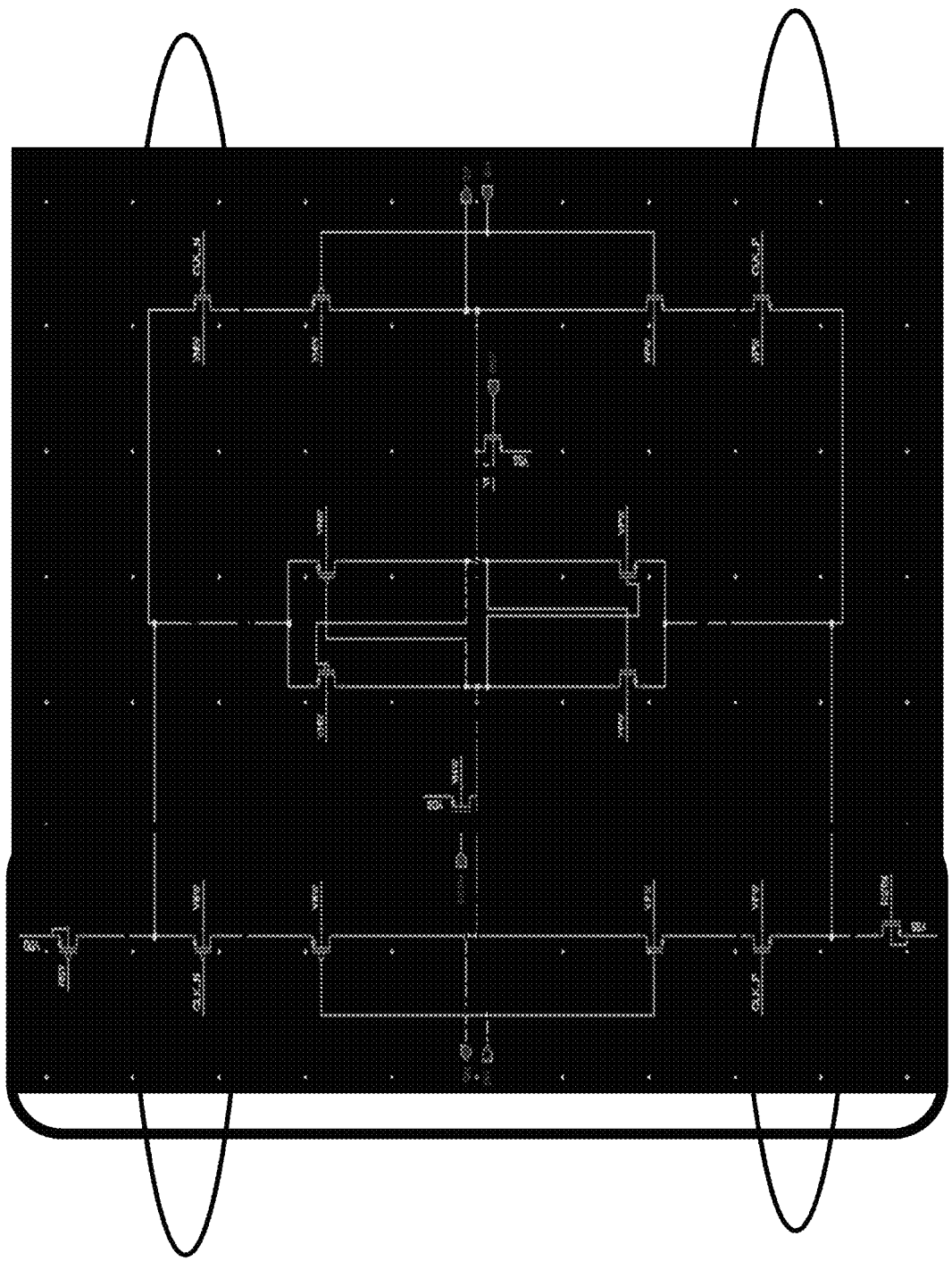

FIG. 9a and FIG. 9b illustrate CML IQ latch.

Figure 10:
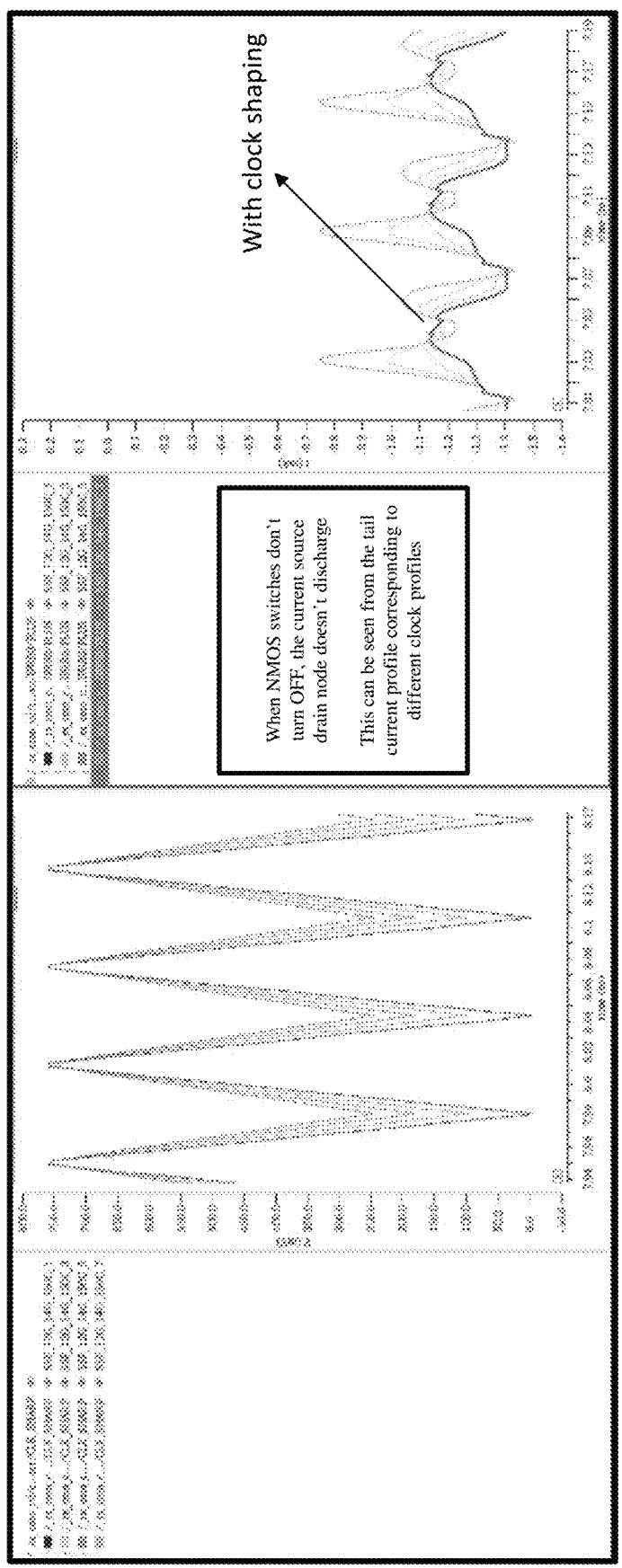
FIG. 10 illustrates current settling through the clock shaper.

FIG. 10 illustrates current settling through the clock shaper. FIG. 10 at least clarifies that if the divider output settling must be limited by just the output time constant, the current source should not switch off. This can be achieved using CML clock drivers at the cost of additional power and losing out CMOS mode at lower frequencies. As a cost-effective measure, the clock shaper described herein is employed to save power.

As shown in FIG. 10, when NMOS switches don't turn OFF, the current source drain node doesn't discharge. This may be observed from the tail current profile corresponding to different clock profiles.

Figure 11:
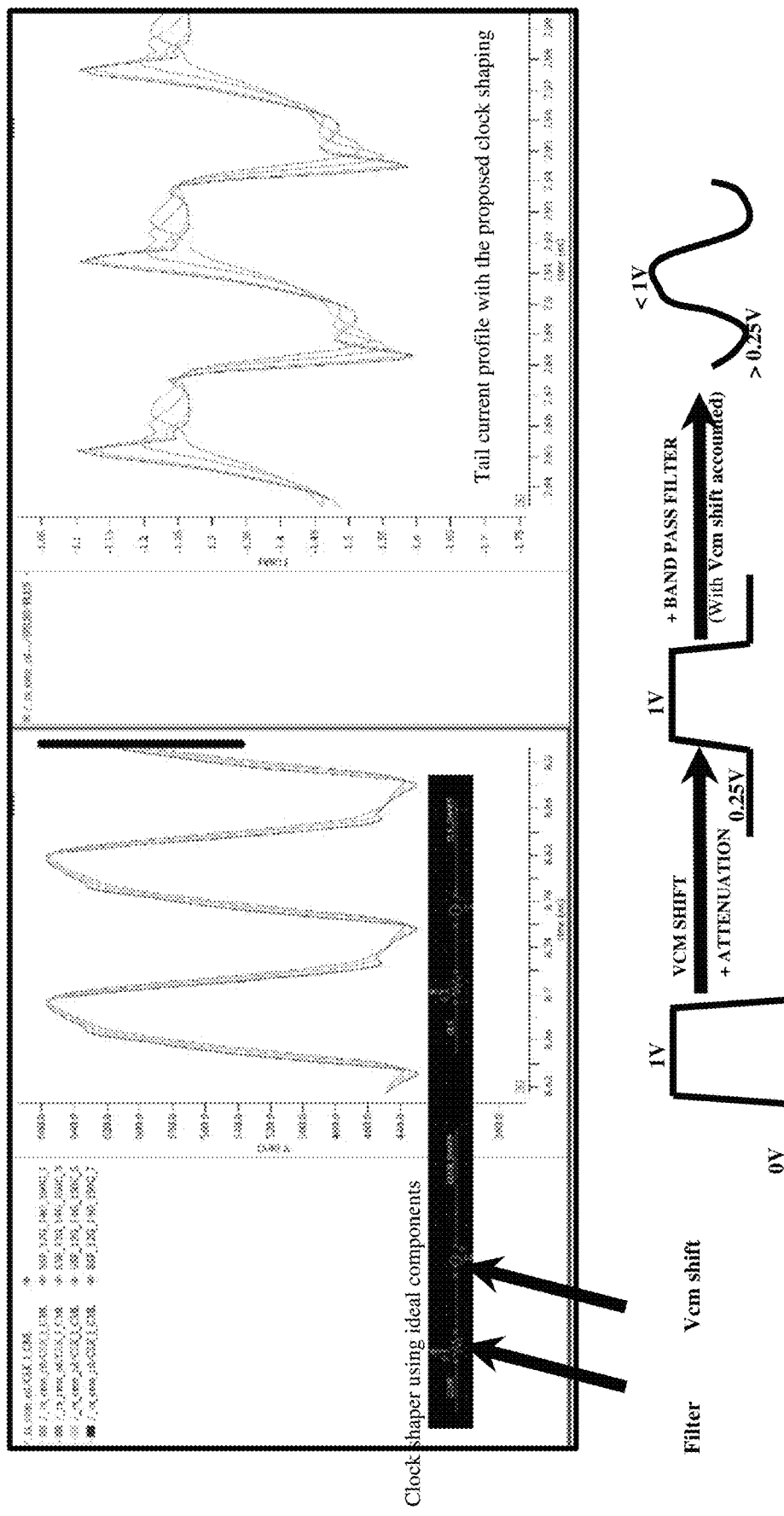
FIG. 11 illustrates a clock shaping operation.

FIG. 11 illustrates a clock shaping operation. Specifically, FIG. 11 illustrates a tail-current profile with the clock shaping described herein.

Figure 12:
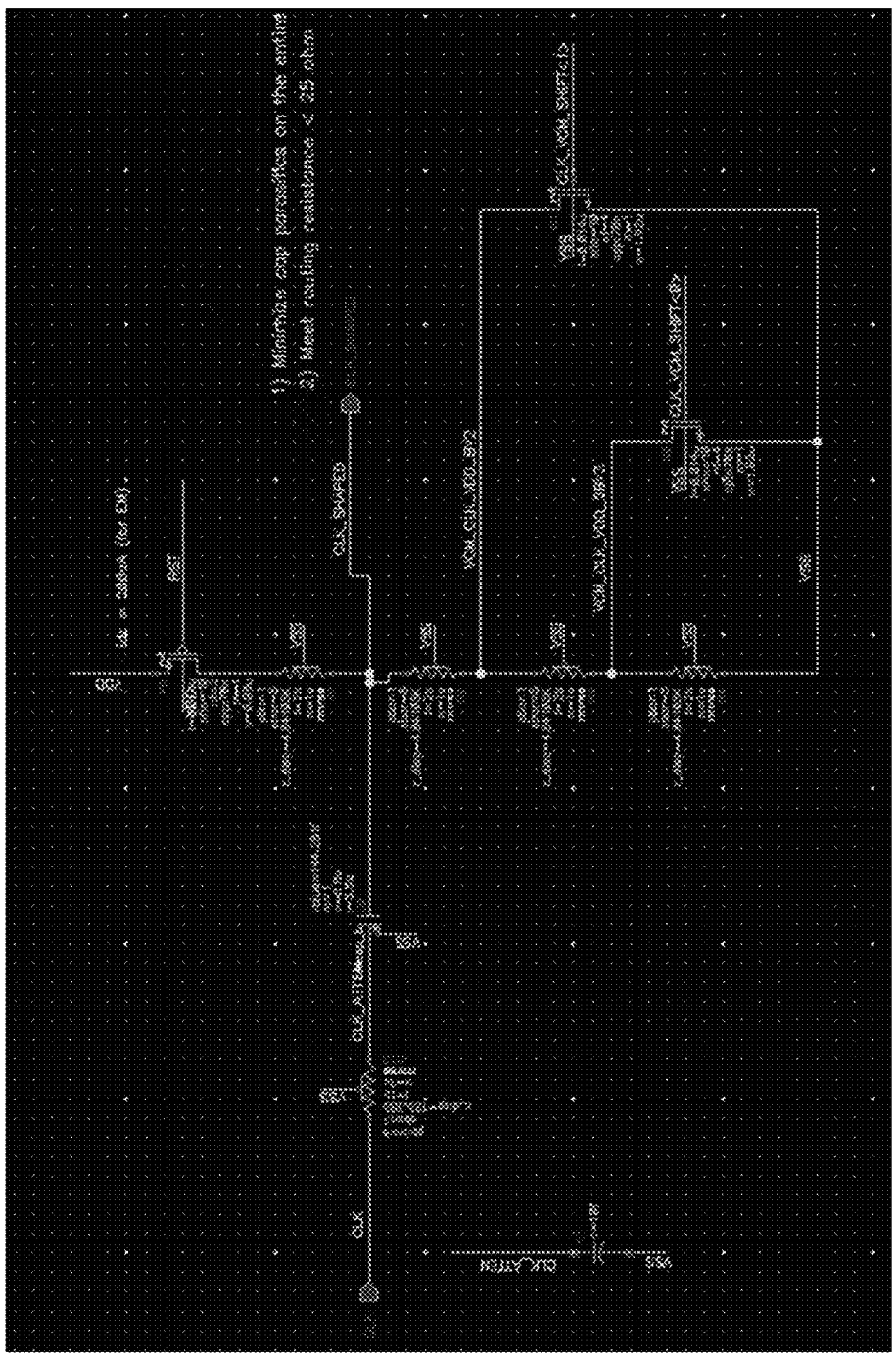
FIG. 12 illustrates a clock shaper schematic.

FIG. 12 illustrates a clock shaper schematic. The clock shaper circuit as the clock processing circuit 104 in FIG. 2 ensures that the clock switches do not turn off and thereby increase current source settling time.

Figure 13:
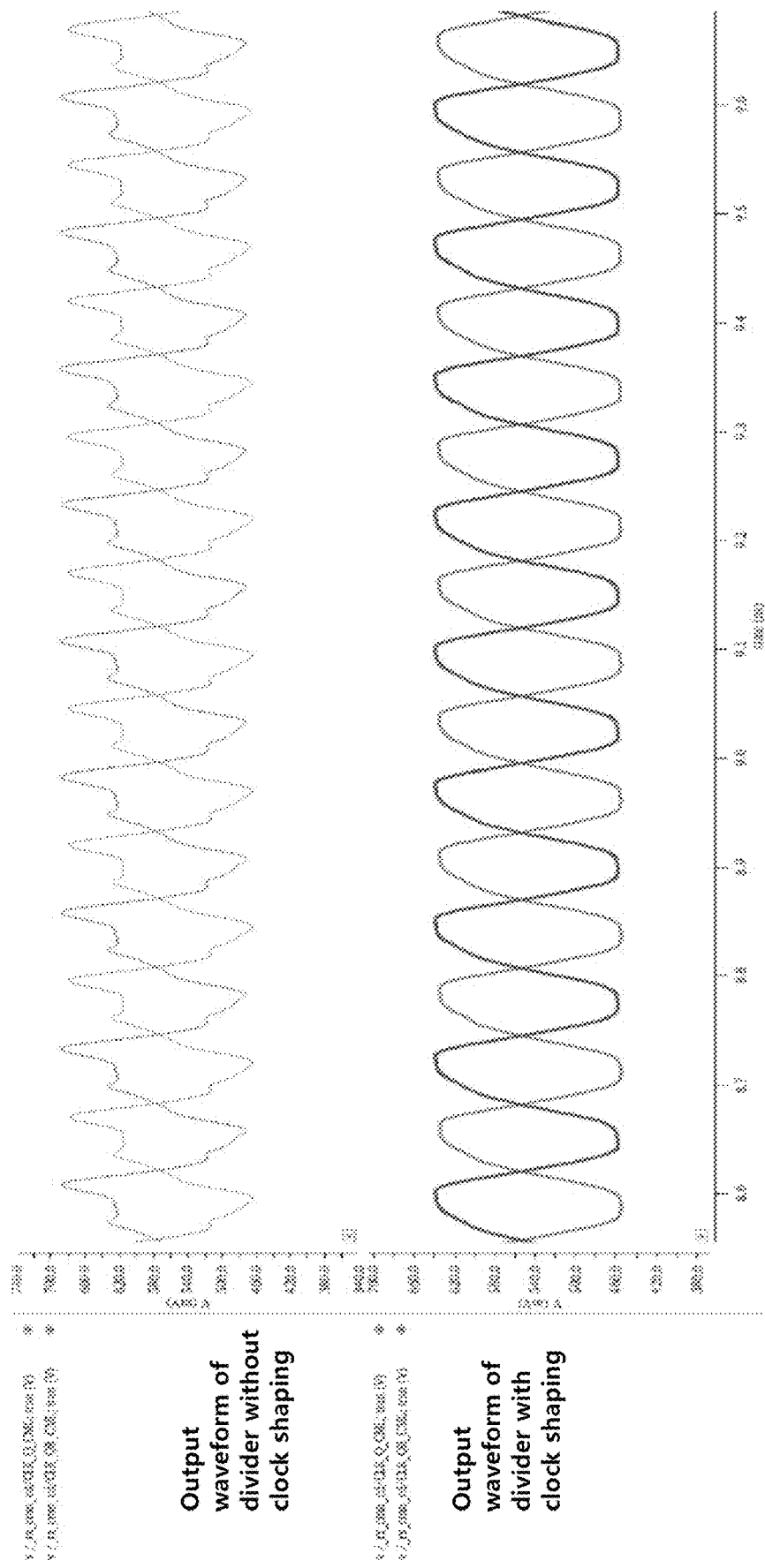
FIG. 13 illustrates an effect of current source settling.

FIG. 13 illustrates an effect of current source settling. FIG. 13 illustrates an output waveform of a divider without clock shaping and its comparison with a divider with clock shaping. As may be seen, the output amplitude and settling time improve with usage of the clock shaper.

Figure 14:
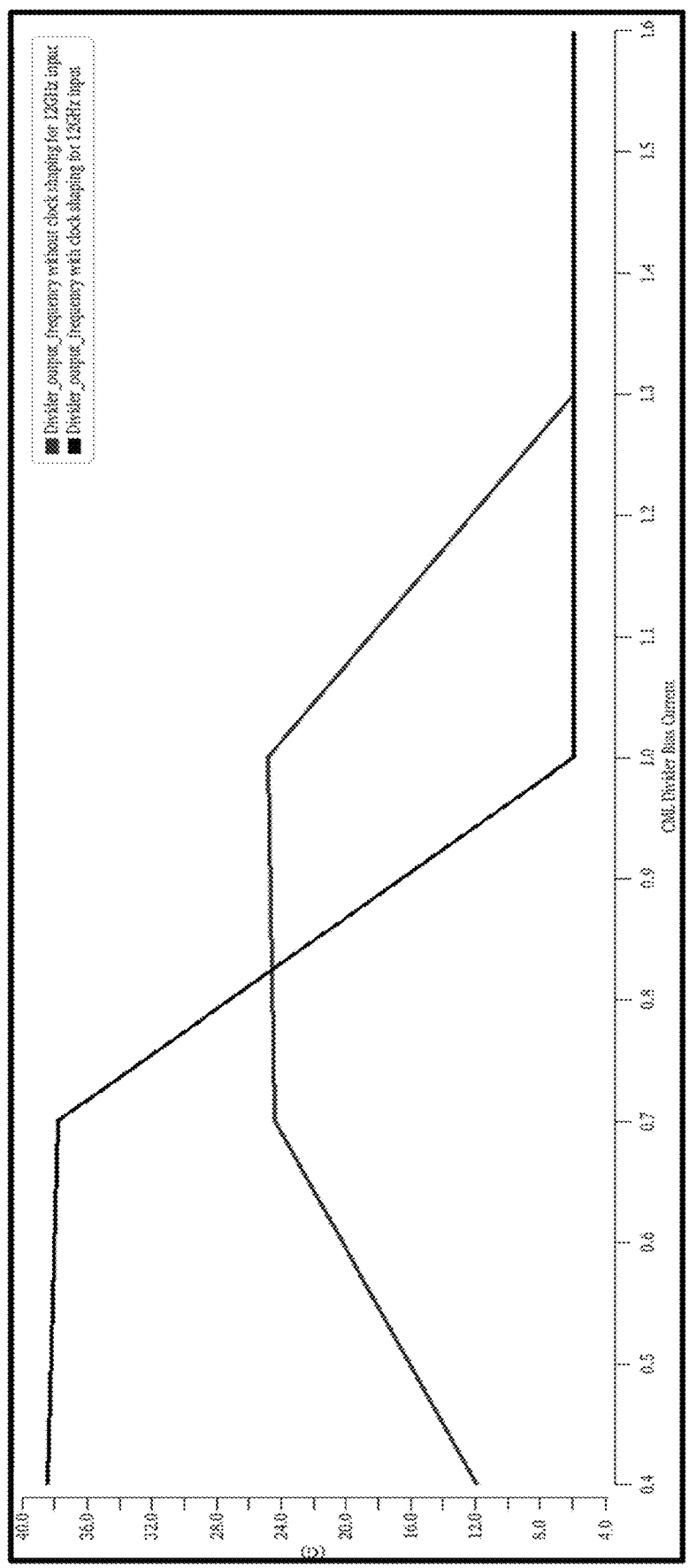
FIG. 14 illustrates lower power consumption with usage of a clock shaper.

FIG. 14 illustrates 30 percent lower power consumption with usage of a clock shaper. The CML divider output frequency is shown with the input bias current to the divider swept. It can be seen that the output frequency failure stops at 30% lower current when the clock shaping is used.

The forthcoming description illustrates self-oscillation. In an example, equilibrium points (for example eighteen points) are considered for measuring self-oscillation. All these Q points are examined to catch possible instability issues. Some of these cases translate to oscillations. This leads to functional failure, higher jitter, or poor waveforms. The eighteen Q points are mentioned as follows:
CLK=CLKB=Vcm (To check effect of poor rise/fall time cases and low clock amplitude cases)–[6]
    Common mode operating points [3]
    Differential operating points [3]
CLK,CLKB=(1,0) [4]—No oscillation possible in this mode as there is no loop
    Differential [3]
    Common mode [1]
CLK,CLKB=(0,1) [4]—No oscillation possible in this mode as there is no loop
    Differential [3]
    Common mode [1]

Figure 15:
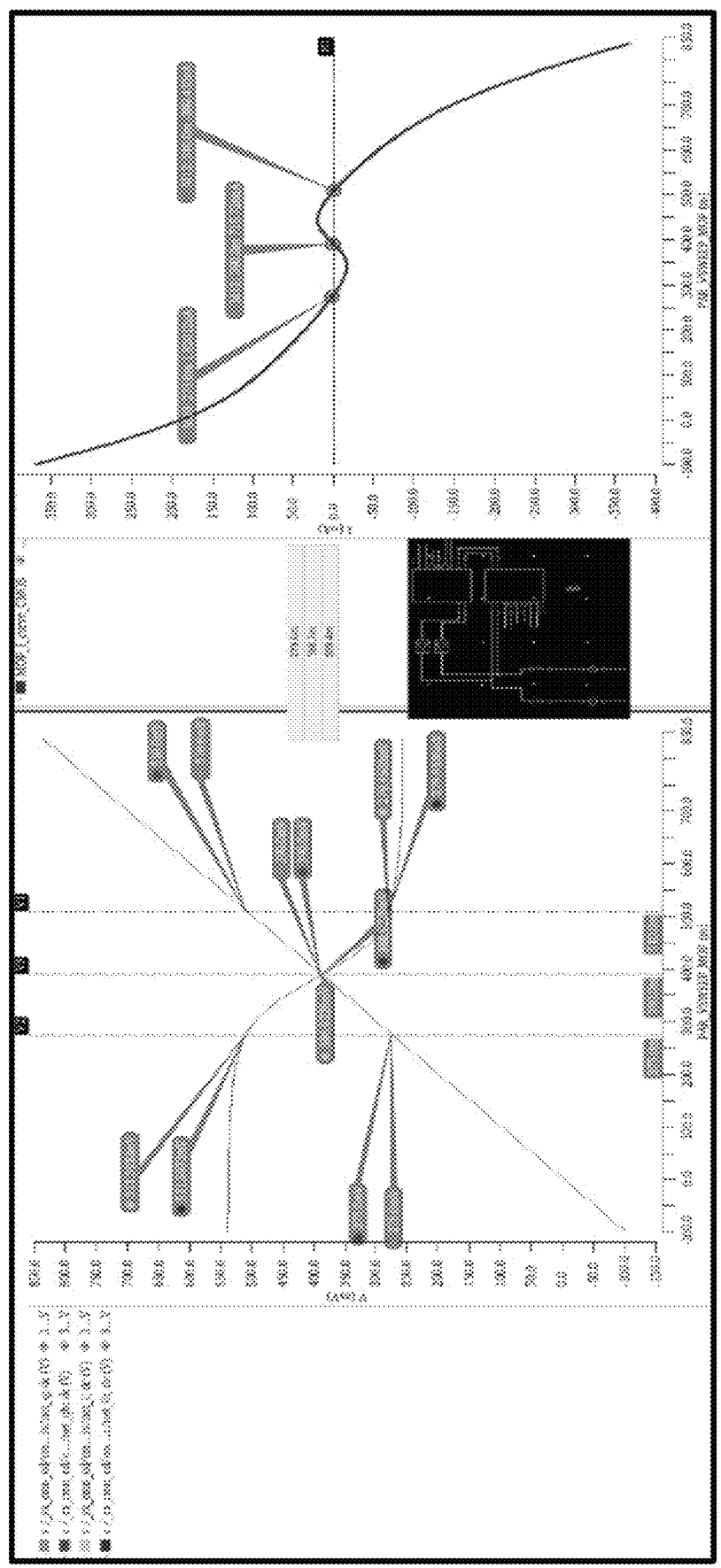
FIG. 15 illustrates three equilibrium points or three Q points.

CLK=CLKB=0-[2]
  Differential [1]—self-oscillations possible in this point
  Common mode [1]
CLK=CLKB=1-[2]
  Differential [1]—self-oscillations possible in this point
  Common mode [1]
  Checking MOP
With 1 single voltage source on a node
With 2 voltage sources on I and IB or Q and QB to check if common mode equilibrium points exist FIG. 15 illustrates three equilibrium points or three Q points with CLK=CLKB=Vcm and common mode inputs.

Figure 16:
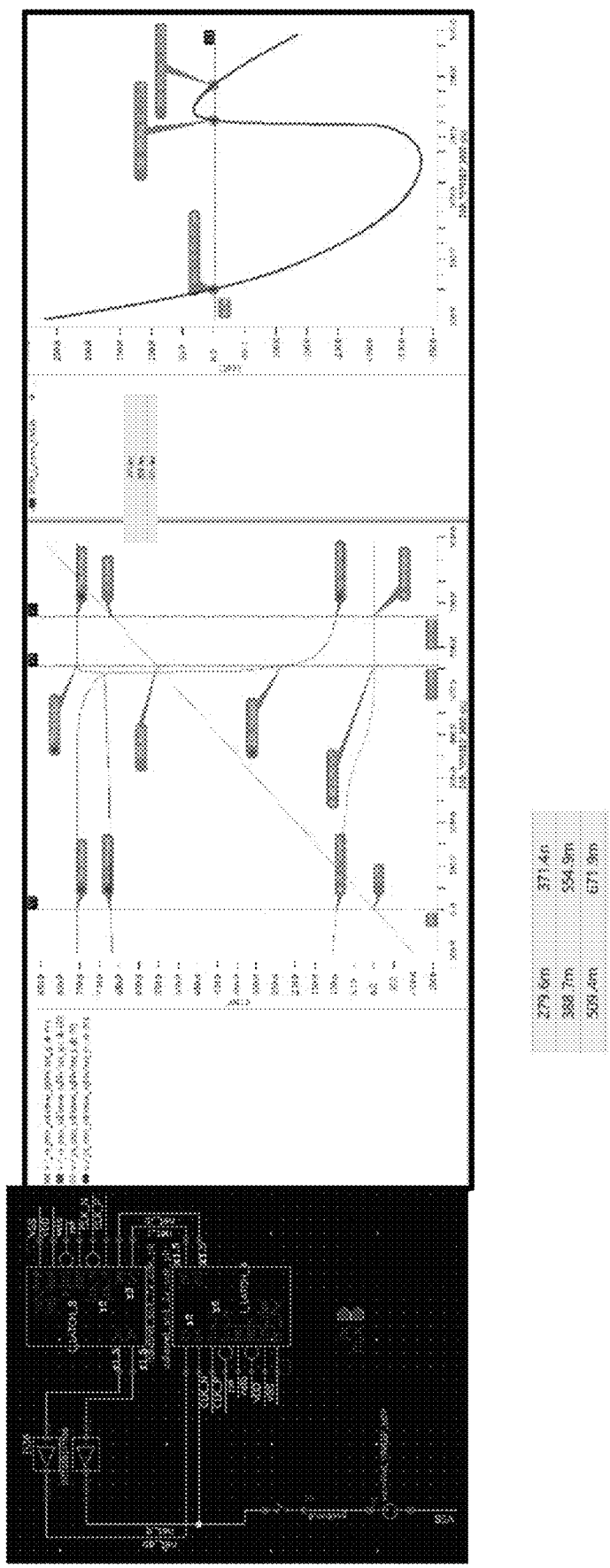
FIG. 16 illustrates a number of possible operating points as differential.

FIG. 16 illustrates a number of possible operating points as differential. Without forcing the common mode condition, there are three equilibrium points with CLK=CLKB=Vcm. From the voltages, it can be seen that this is not the same as the Vcm points. In total, there are six possible equilibrium points for the CMOS IQ divider with CLK=CLKB=Vcm.

Figure 17:
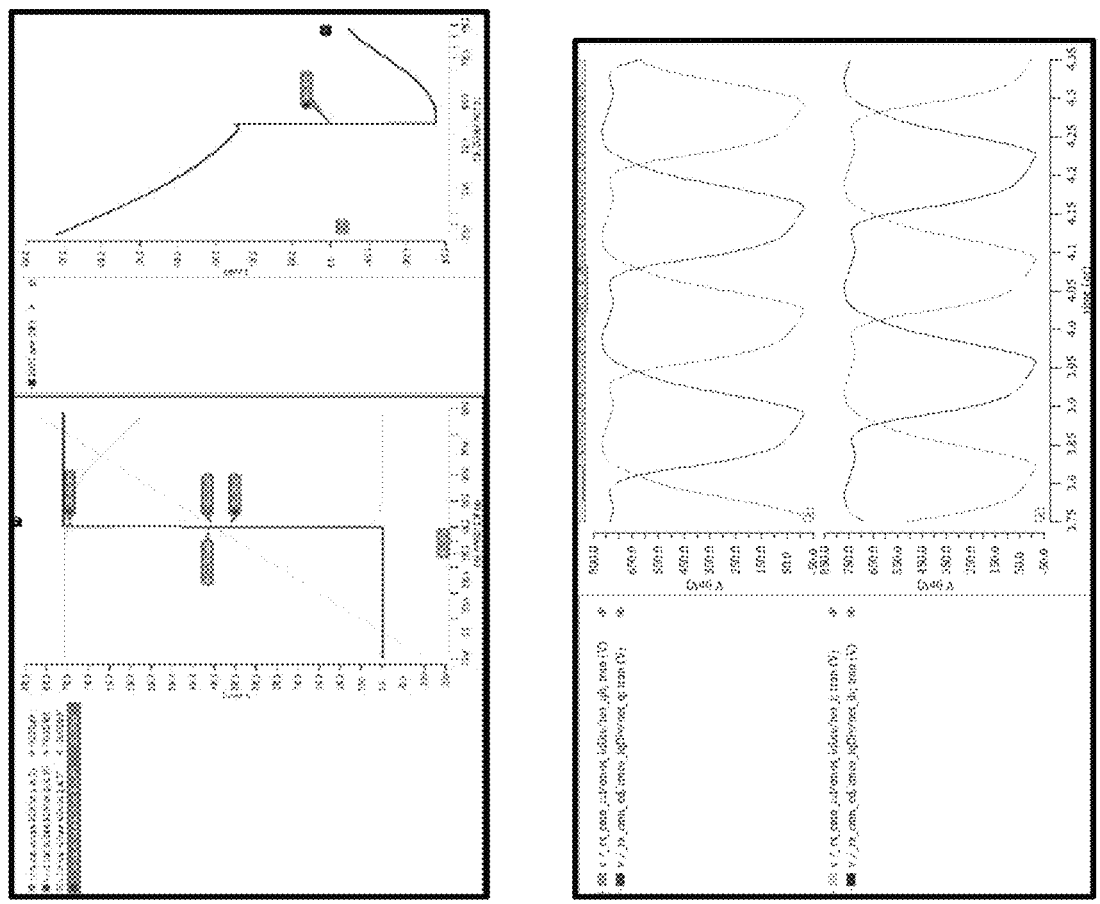
FIG. 17 illustrates a total number of possible operating points.

FIG. 17 illustrates a total number of possible operating points defined by CLK=CLKB=0. There is one equilibrium point with CLK=CLKB=0. Self-oscillation is observed in this equilibrium point.

The forthcoming figures explain resolution of self-oscillation when an input clock is present. Multiple causes of self-oscillation are examined and solved, including:
  i) Low amplitude input clock. This makes the latch stronger than the main input path.
  ii) Poor rise/fall time of input clock. More time near input clock at Vcm.
  iii) Duty cycle distortion in the input clock: This makes the latch stronger than the main input path.
  iv) Complete discharge of the clock shaper circuit. Accordingly, more time is expended near input clock at Vcm.

Figure 18:
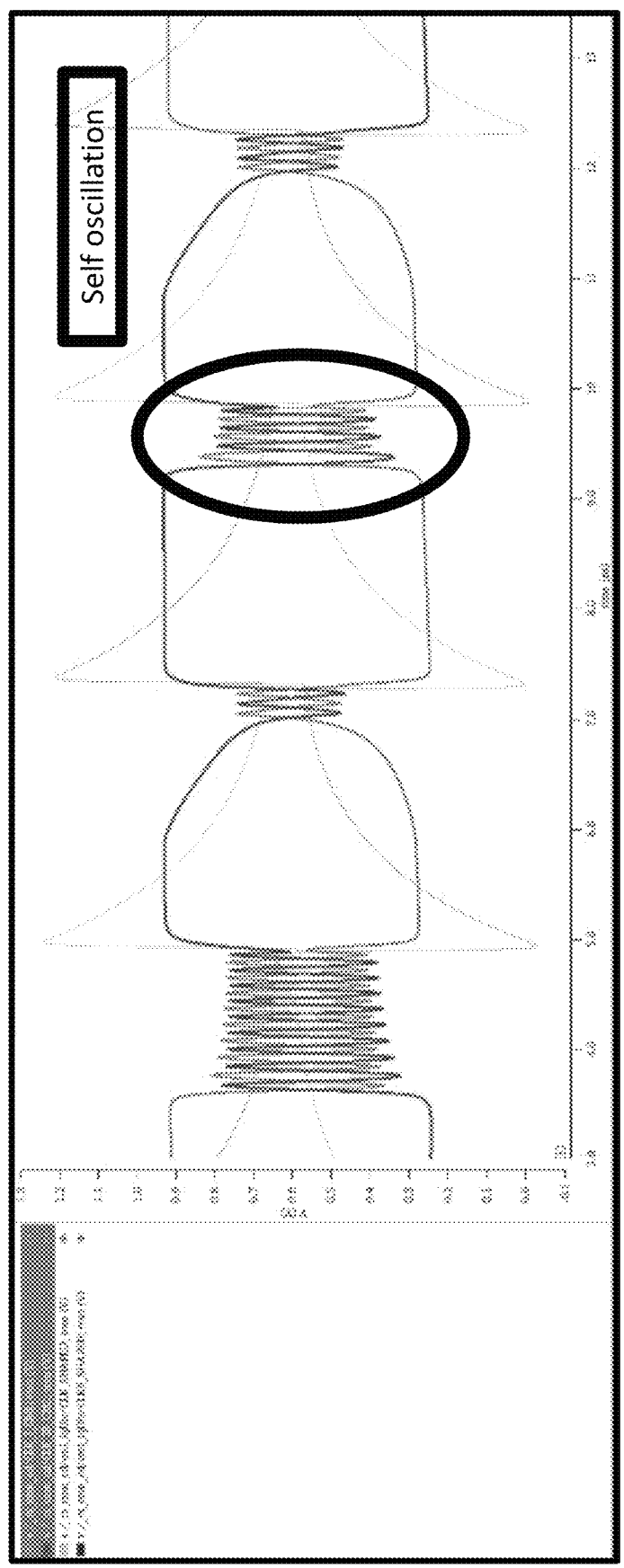
FIG. 18 illustrates self-oscillation when an input clock is present.

FIG. 18 illustrates self-oscillation when the input clock is present. The figure illustrates self-oscillation due to complete discharge of the clock shaper circuit.

Figure 19:
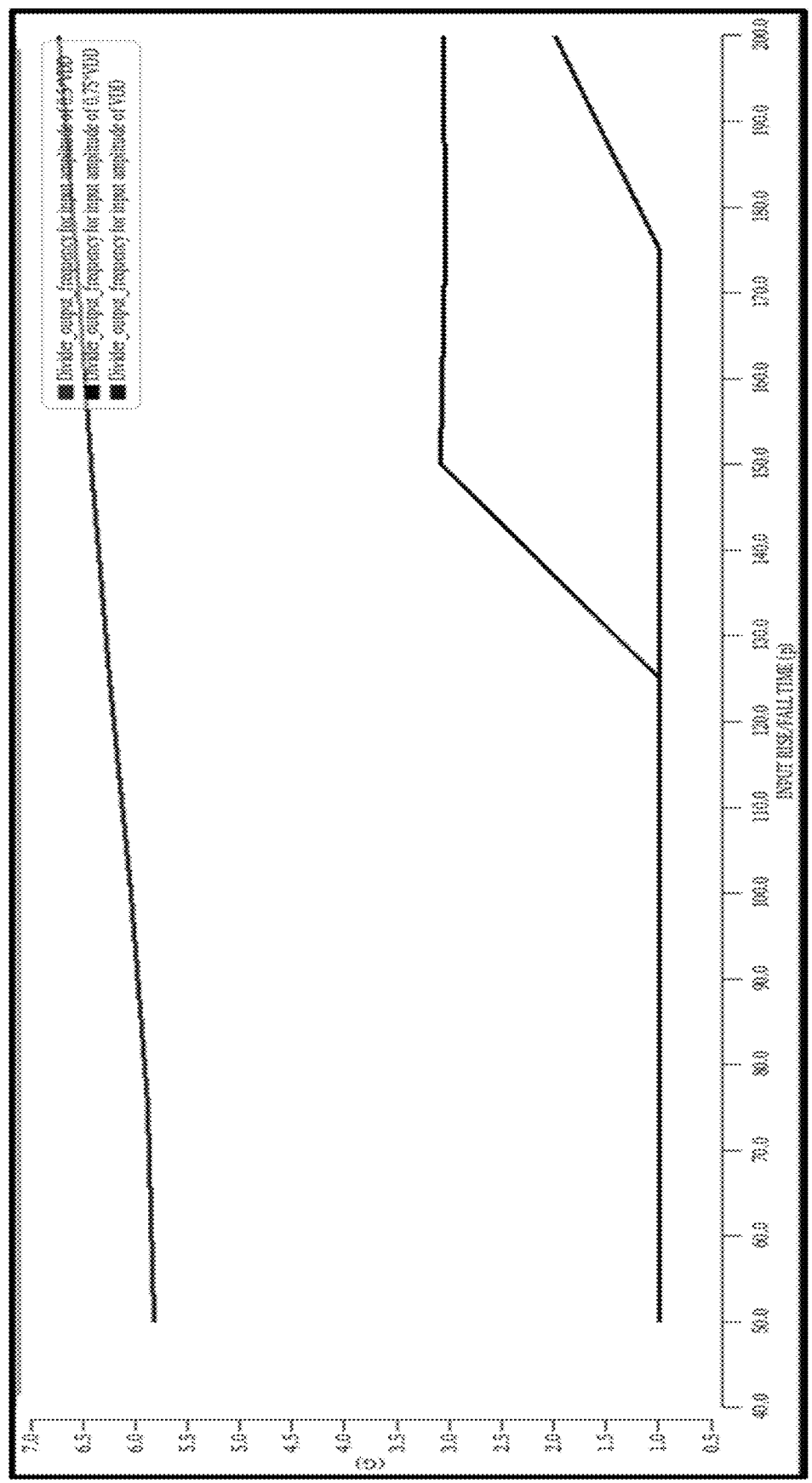
FIG. 19 illustrates self-oscillation as a function of input amplitude and slope.

FIG. 19 illustrates self-oscillation as a function of input amplitude and slope. FIG. 19 illustrates the self-oscillation check for an input clock frequency of 2 GHz. The expected output frequency of the divider is 1 GHz. The input clock amplitude lies between 0.5*VDD and VDD and slope is varied by varying the rise/fall time between 50ps and 200ps. It can be seen that at higher clock amplitudes, even with a poor rise/fall time, self-oscillation is not observed.

Figure 20:
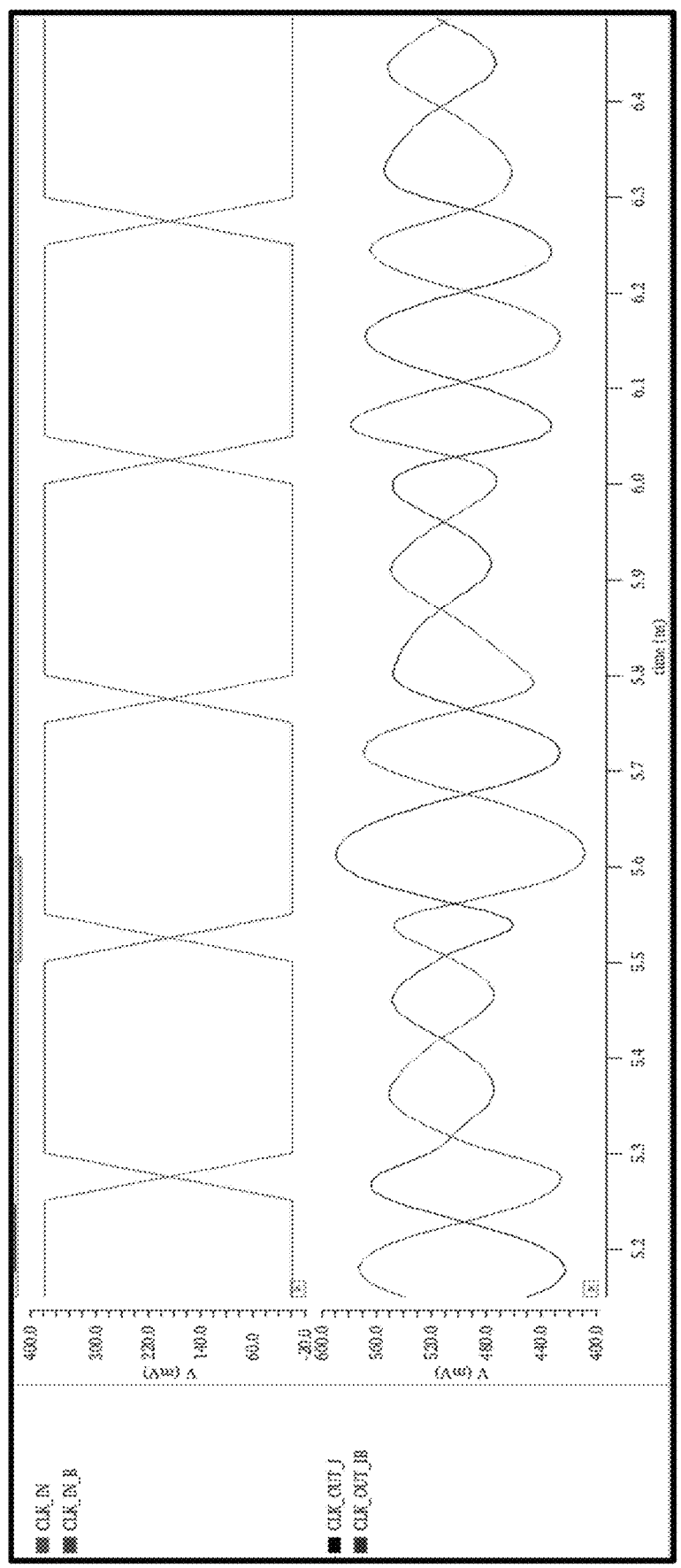
FIG. 20 illustrates self-oscillation when input amplitude is low.

FIG. 20 illustrates self-oscillation when input amplitude is low. FIG. 20 illustrates the self-oscillation for an input clock frequency of 2 GHz when input amplitude is low. The expected output frequency of the divider is 1 GHz. The input clock amplitude is 0.5*VDD and rise/fall time is 50ps.

Figure 21:
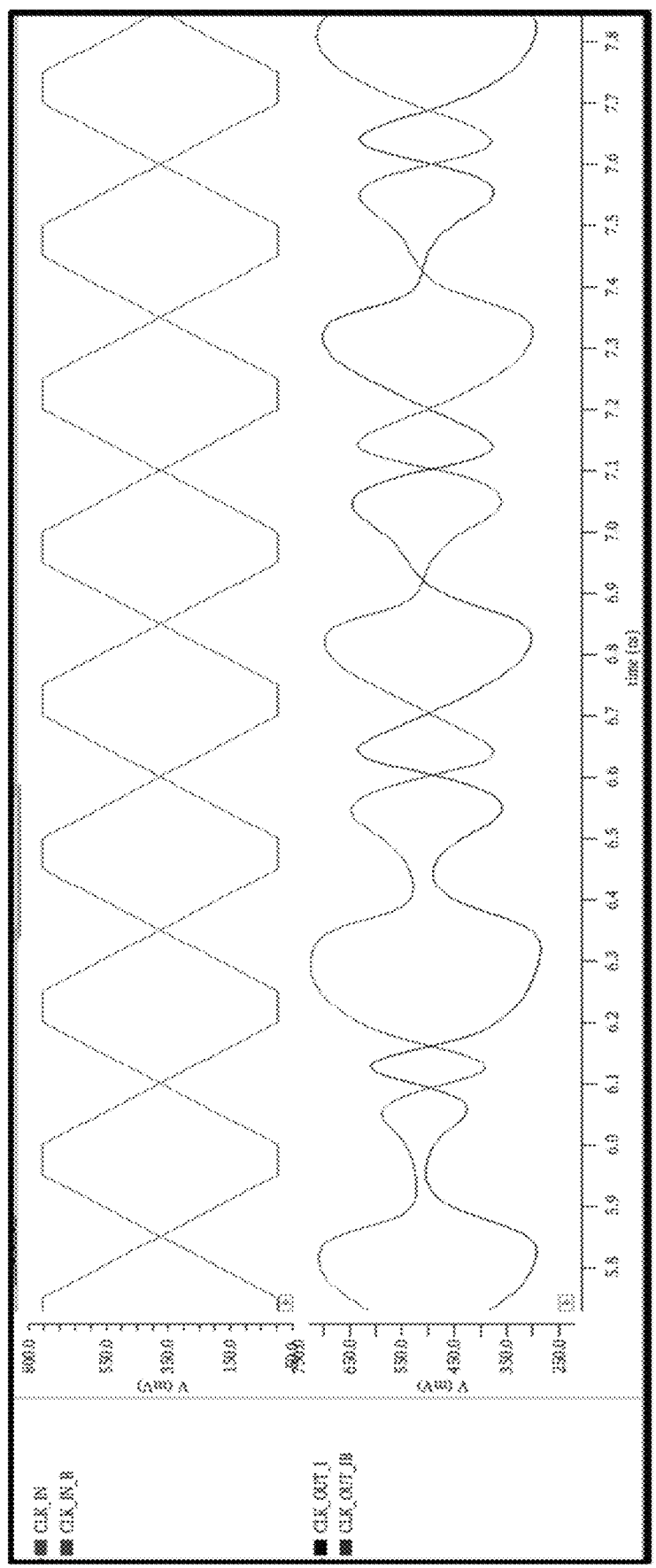
FIG. 21 illustrates self-oscillation when input amplitude is high.

FIG. 21 illustrates self-oscillation when input amplitude is high. FIG. 21 illustrates the self-oscillation for an input clock frequency of 2 GHz when input amplitude is high. The expected output frequency of the divider is 1 GHz. The input clock amplitude is VDD and rise/fall time is 200ps.

Overall, the following steps have been taken to remedy the self-oscillation issue:
  a) Evaluating the stability of all possible Q-points;
  b) Understanding the mechanism of self-oscillation based on negative resistance of the latch;
  c) Designing for a discharge time constant of the clock shaper circuit at least ten times higher than operating frequency;
  d) Setting input clock amplitude higher than verified threshold ensuring that the main path (input-controlled path) is much stronger than the latch path;
  e) Controlling the slope of the clock input to be comparable or lower than the self-oscillation period; and
  f) Attenuating the duty cycle distortion in the input clock using the clock shaper.

Figure 22:
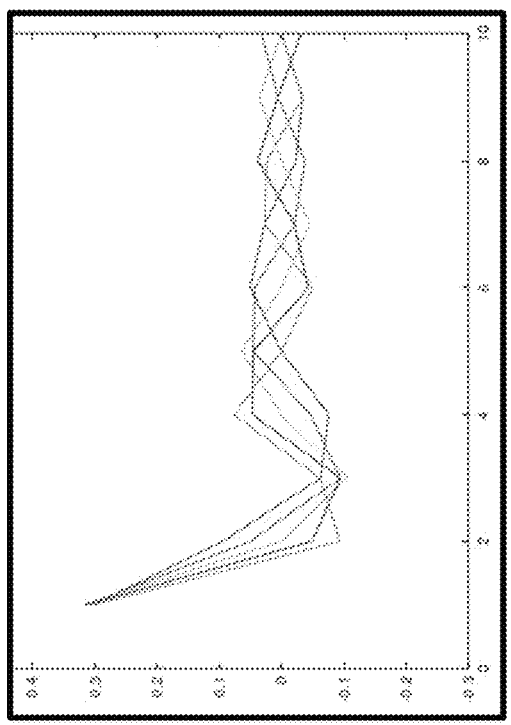
FIG. 22 illustrates duty cycle correction using bandpass filter.
Figure 22:
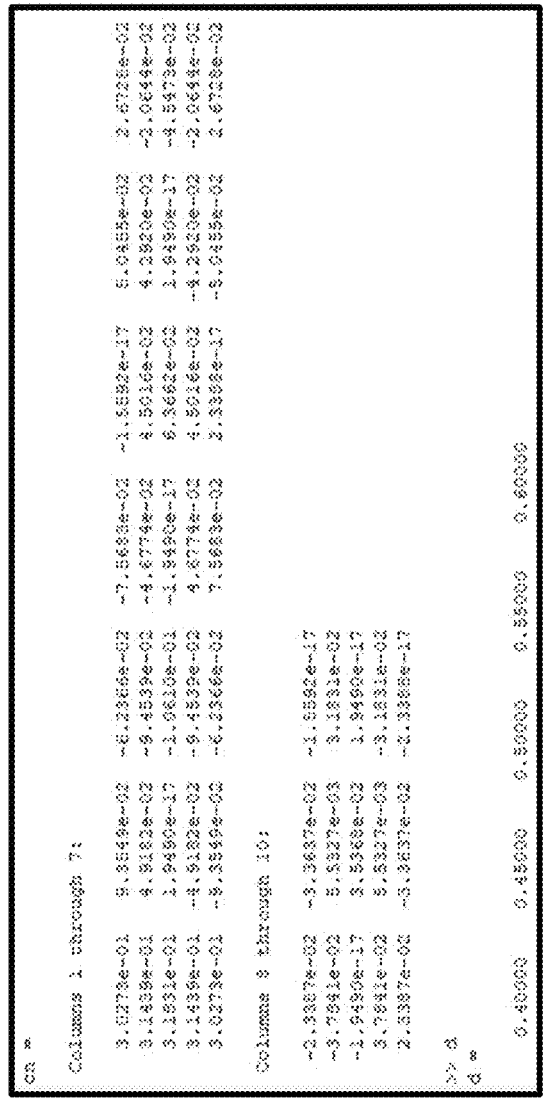
Figure 23:
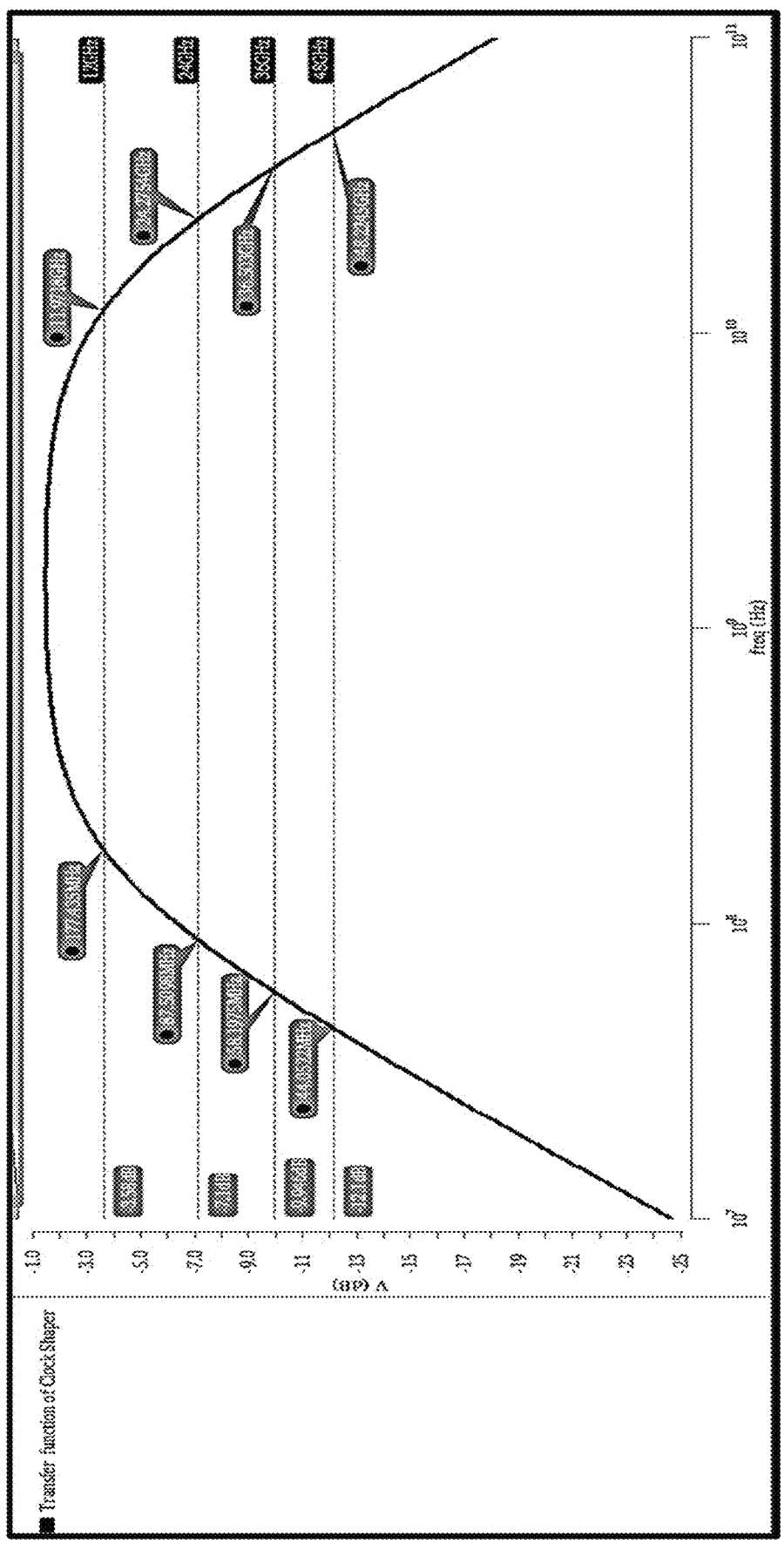
FIG. 23 illustrates bandpass transfer function of a clock shaper.

FIG. 22 illustrates duty cycle correction using bandpass filter. If the duty cycle of a square wave duty cycle is swept, the corresponding frequency spectrum is shown in FIG. 22. For a 50% duty cycle, only odd harmonics are observed. For 40 and 60%, the 2nd harmonic is ⅓ of fundamental. This needs to be filtered out to obtain a sine wave with very little distortion, and can be achieved using a bandpass filter FIG. 23 illustrates bandpass transfer function of a clock shaper. The relative attenuation of the 2nd harmonic relative to the 1st harmonic is ~4 dB, which corresponds to attenuation of ⅓. For a 40% duty cycle, the 2nd harmonic is ⅓ of the fundamental and the bandpass filter further filters the 2nd harmonic out by ⅓ to make it ⅑ of fundamental.

Figure 24:
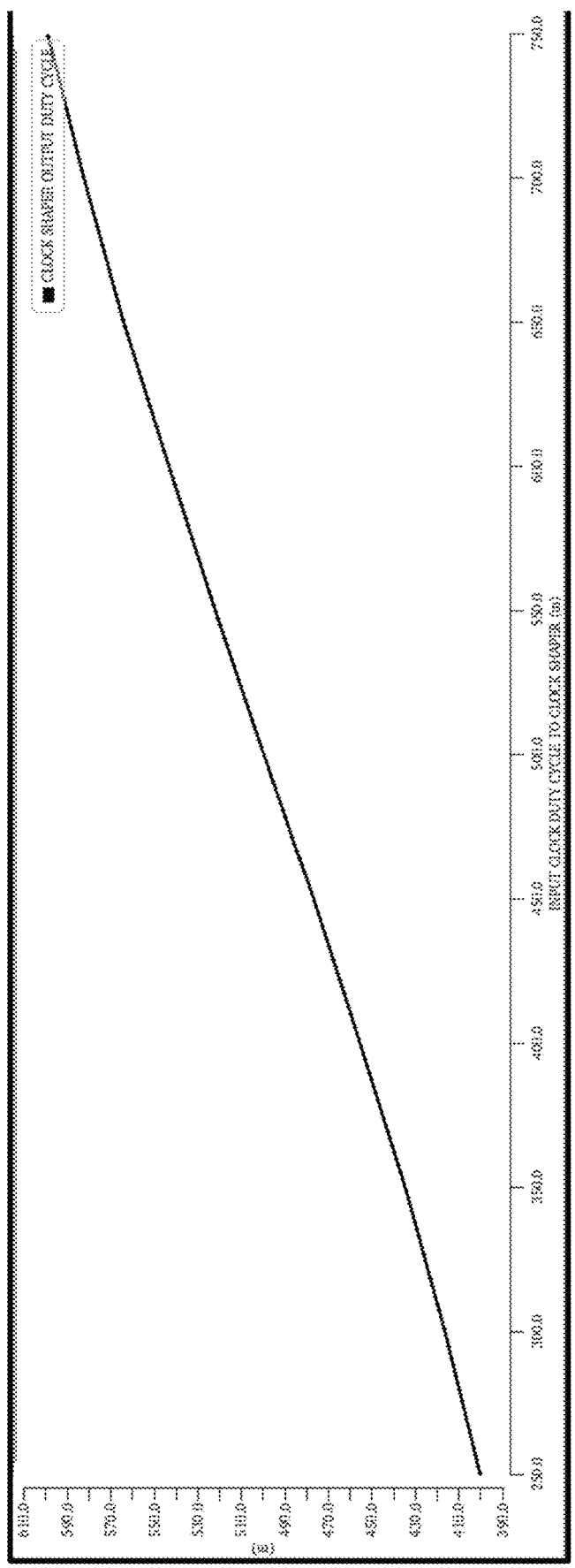
FIG. 24 illustrates duty cycle correction using clock shaper.

FIG. 24 illustrates duty cycle correction using a clock shaper. With the bandpass filtering, an input clock duty cycle of 25% to 75% translates to 40% to 60% at the output. The attenuation corner frequency is programmable based on the input clock frequency. This ensures that for all input frequencies, the duty cycle correction is valid.

Figure 25:
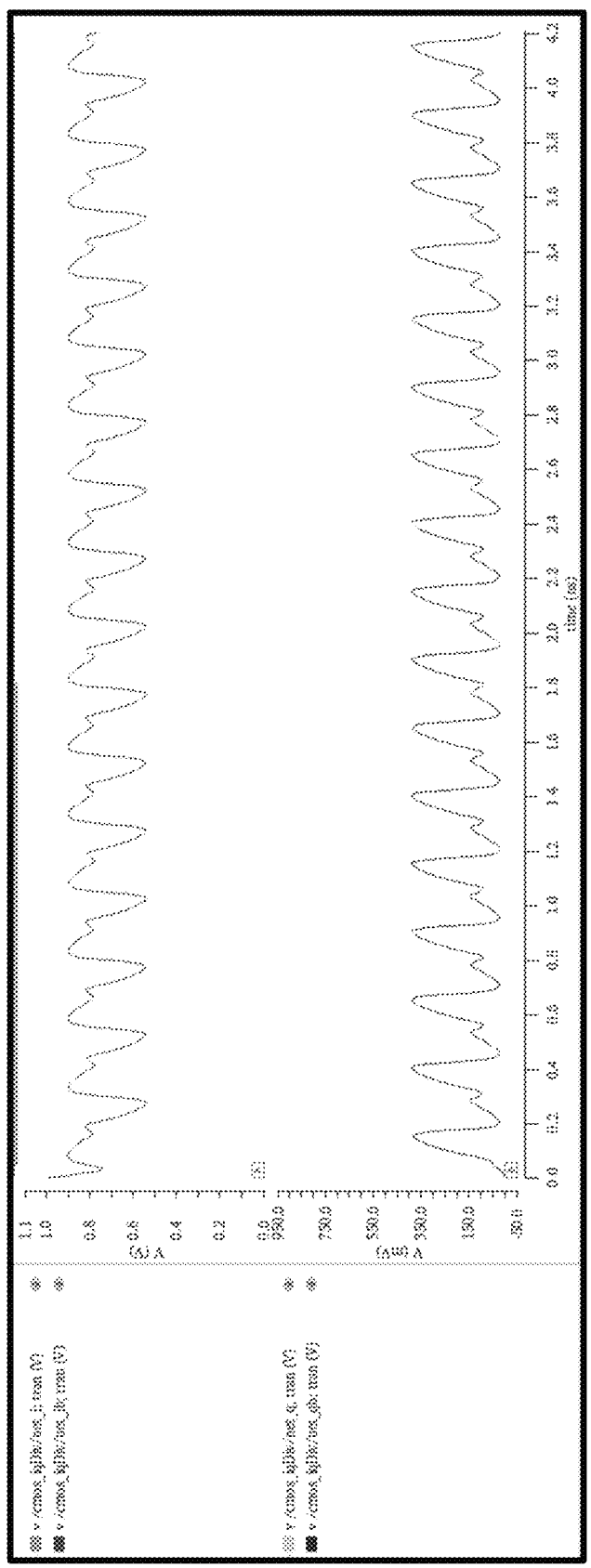
FIG. 25 illustrates latch-up in a CMOS divider.

FIG. 25 illustrates latch-up in a CMOS divider. Without initialization, latch-up issue may occur. The present figure illustrates the outputs of the CMOS IQ divider. If the latch gain is very low, the IQ divider can degenerate into a chain of back-to-back connected inverters resulting in latchup. To address this, the divider is required to start from the highest point of latch gain. This is the VDD/2 point.

Figure 26:
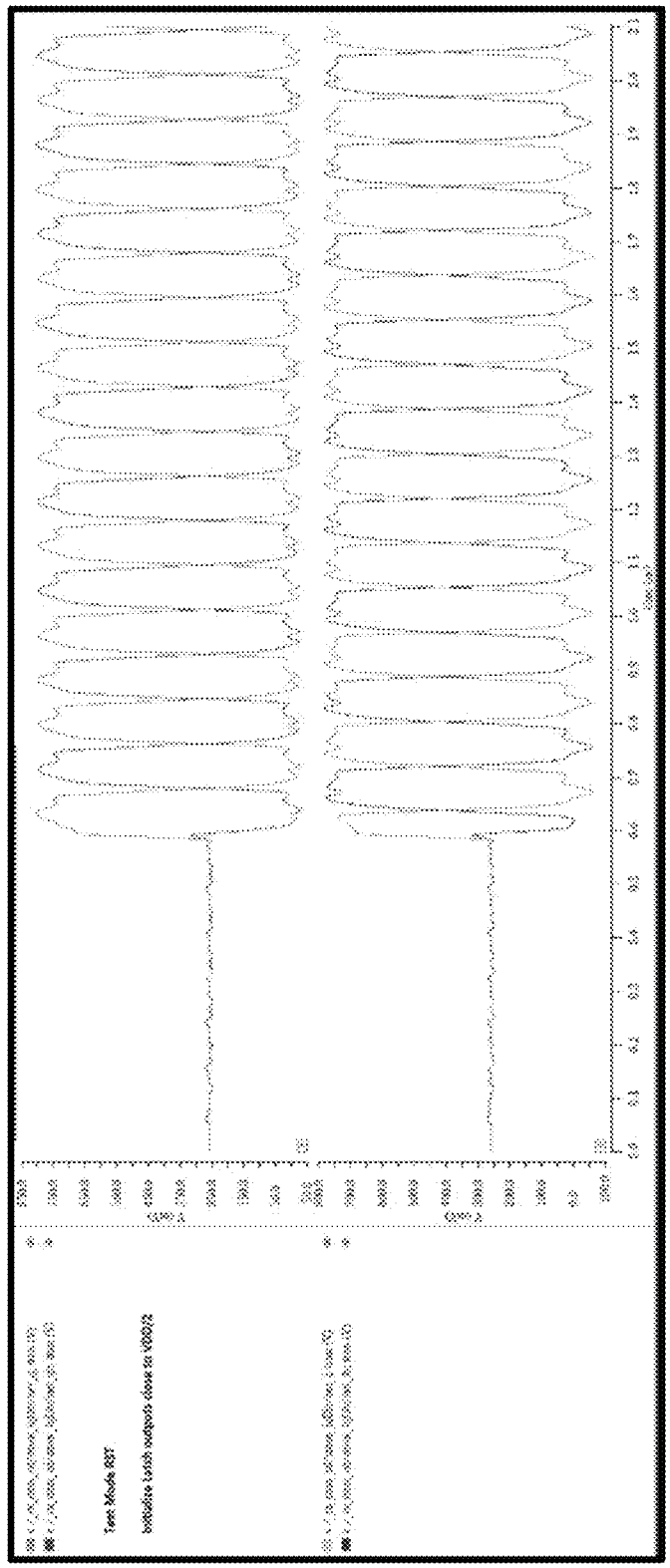
FIG. 26 illustrates initialization for latch-up recovery.

FIG. 26 illustrates initialization for latch-up recovery. The outputs of latch initialized close to VDD/2. This at least ensures that the divider avoids any latch-up state.

Figure 27:
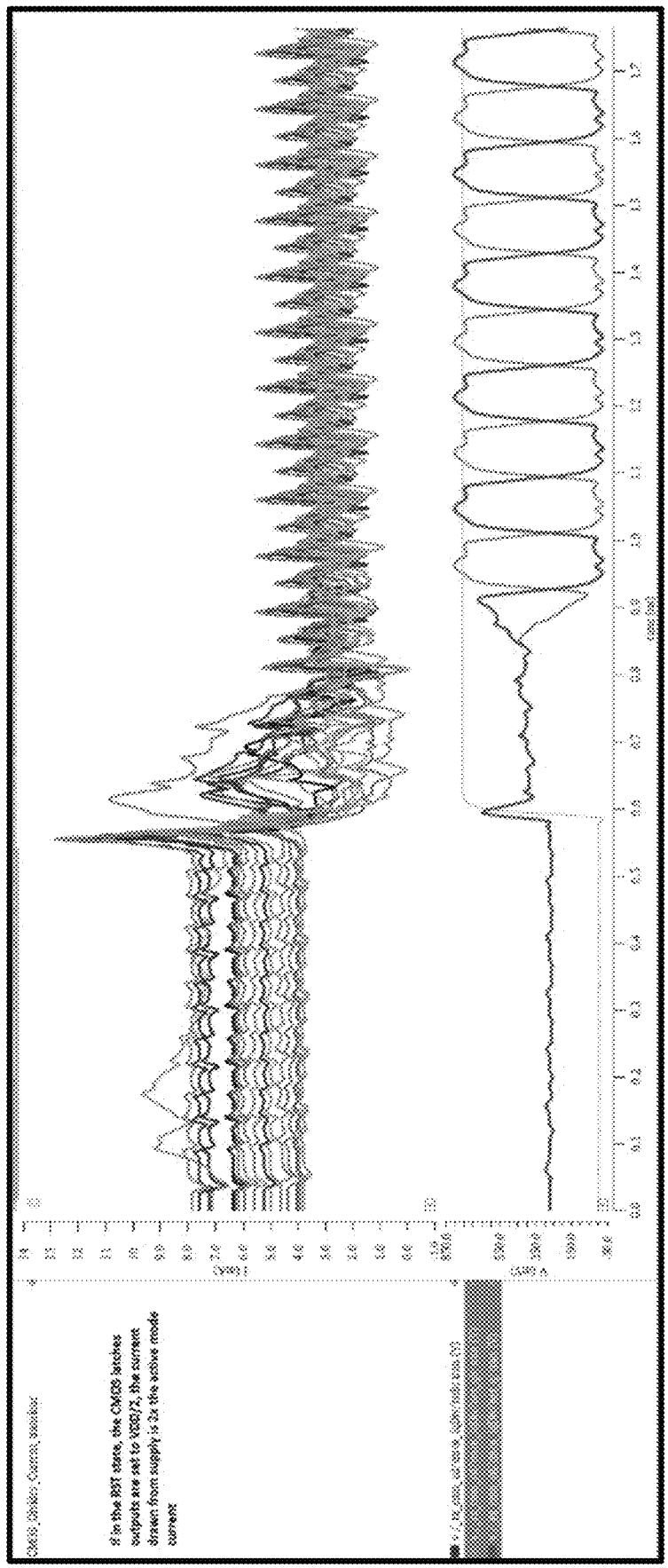
FIG. 27 illustrates initialization for latch-up recovery.

FIG. 27 illustrates initialization for latch-up recovery. A higher current is drawn during RST state due to the inverters following the latches. This is the closest to Vcm point where the latch gain is enough to prevent any common mode latchup. If there is some latchup point close to VDD/0 point, this is the other closest chance to bring it to a self-oscillating state and farthest from latchup state.

At least based on the aforesaid description, the present subject matter renders an input clock shaping technique to reduce the power consumption by 30%. The clock shaper reduces the power of the input clock distribution by 4×. The clock shaper attenuates the input clock's duty cycle distortion to help remedy self-oscillation. The initialization-based solution described herein may be used to remedy the problem of latch-up.

Overall, the present subject matter describing control of input clock waveform amplitude and slope may be used to remedy the problem of self-oscillation across all frequencies. The present subject matter offers an optimal way of combining an CML IQ divider and a CMOS IQ divider to improve power supply noise rejection by 2× at high frequencies and low power operation at lower frequencies.

While specific language has been used to describe the present subject matter, any limitations arising on account thereto, are not intended. As would be apparent to a person of ordinary skill in the art(s) relevant to the subject matter described herein, various working modifications may be made to the method in order to implement the inventive concept as taught herein. The drawings and the foregoing description give examples of embodiments. Those skilled in the art will appreciate that one or more of the described elements may well be combined into a single functional element. Alternatively, certain elements may be split into multiple functional elements. Elements from one embodiment may be added to another embodiment.

We claim:

1. An apparatus for in-phase and quadrature phase ("IQ") generation, comprising:
   a CMOS clock distributor for providing a clock input;
   a first IQ divider circuit configured for receiving the clock input and dividing the clock input into in-phase and quadrature phase (IQ) output;
   a clock processing circuit for processing the clock input into a processed clock input;
   a second IQ divider circuit for receiving the processed clock input and dividing the processed clock input into in-phase and quadrature phase (IQ) output, wherein the processed clock input is received by the second IQ divider circuit and not received by the first IQ divider circuit; and
   a multiplexer circuit coupled to the first IQ divider circuit and the second IQ divider circuit for selecting the IQ output from the first IQ divider circuit or the second IQ divider circuit.

2. The apparatus as claimed in claim 1, wherein the multiplexer circuit is configured for selecting the IQ output based on criteria defined by a high-frequency operation and a low-frequency operation.

3. The apparatus as claimed in claim 1, wherein the first IQ divider circuit comprises to a CMOS IQ divider circuit and the second IQ divider circuit comprises a CML IQ divider circuit.

4. The apparatus as claimed in claim 3, wherein the clock processing circuit corresponds to a clock shaper circuit configured to convert the clock input into a low swing sine wave for operation of the CML IQ divider circuit.

5. The apparatus as claimed in claim 4, wherein the clock shaper circuit is defined by:
   a discharge time constant higher than a frequency of the clock input;
   an input clock amplitude set higher than a threshold;
   controlling a slope of the clock input at a period approximately equal to a detected self-oscillation period within the second IQ divider circuit, and
   attenuating a duty cycle distortion within the clock input.

6. The apparatus as claimed in claim 5,
   wherein the clock shaper circuit implements a duty cycle correction using a bandpass filter, and
   an attenuation corner frequency of the bandpass filter is based on the frequency of the clock input.

7. The apparatus as claimed in claim 6, wherein bandpass filtering using the bandpass filter is defined by translation of an input clock duty cycle of 25% to 75% to 40% to 60% at the output for removal of a second or higher order harmonic.

8. The apparatus as claimed in claim 1, wherein the first IQ divider circuit is defined by the CMOS clock distributor and is configured for initializing outputs at an operating point defined by half of a supply voltage VDD.

9. A method for in-phase and quadrature phase ("IQ") generation, comprising:
   providing a clock input by a CMOS clock distributor;
   receiving the clock input by a first IQ divider circuit configured for dividing the clock input into in-phase and quadrature phase (IQ) output;
   processing the clock input by a clock processing circuit into a processed clock input;
   receiving the processed clock input by a second IQ divider circuit for dividing the processed clock input into in-phase and quadrature phase (IQ) output, wherein the processed clock input is received by the second IQ divider circuit and not received by the first IQ divider circuit; and
   selecting the IQ output from the first IQ divider circuit or the second IQ divider circuit through a multiplexer circuit coupled to the first IQ divider circuit and the second IQ divider circuit.

10. The method as claimed in claim 9, wherein the multiplexer circuit is configured for selecting the IQ output based on criteria defined by a high-frequency operation and a low-frequency operation.

11. The method as claimed in claim 9, wherein the first IQ divider circuit corresponds to a CMOS IQ divider circuit and the second IQ divider circuit corresponds to a CML IQ divider circuit.

12. The method as claimed in claim 11, wherein the clock processing circuit corresponds to a clock shaper circuit configured to convert the clock input into a low swing sine wave for operation of the CML IQ divider circuit.

13. The method as claimed in claim 12, wherein the clock shaper circuit is defined by:
   a discharge time constant higher than a frequency of the clock input;
   an input clock amplitude set higher than a threshold;
   controlling a slope of the clock input at a period approximately equal to a detected self-oscillation period within the second IQ divider circuit, and
   attenuating a duty cycle distortion within the clock input.

14. The method as claimed in claim 13,
   wherein the clock shaper circuit implements a duty cycle correction using a bandpass filter, and
   an attenuation corner frequency of the bandpass filter is based on the frequency of the clock input.

15. The method as claimed in claim 14, wherein bandpass filtering using the bandpass filter is defined by translation of an input clock duty cycle of 25% to 75% to 40% to 60% at the output for removal of a second or higher order harmonic.

16. The method as claimed in claim 9, wherein the first IQ divider circuit is defined by the CMOS clock distributor and is configured for initializing outputs at an operating point defined by half of a supply voltage VDD.

17. A system for in-phase and quadrature phase ("IQ") generation, comprising:
   a CMOS clock distributor configured to provide a clock input;
   a first IQ divider circuit configured to receive the clock input and divide the clock input into in-phase and quadrature phase (IQ) output;
   a clock processing circuit configured to process the clock input into a processed clock input;
   a second IQ divider circuit configured to receive the processed clock input and divide the processed clock input into in-phase and quadrature phase (IQ) output, wherein the processed clock input is received by the second IQ divider circuit and not received by the first IQ divider circuit; and
   a multiplexer circuit coupled to the first IQ divider circuit and the second IQ divider circuit and configured to select the IQ output from the first IQ divider circuit or the second IQ divider circuit.

18. The system as claimed in claim 17, wherein the first IQ divider circuit comprises a CMOS IQ divider circuit and the second IQ divider circuit comprises a CML IQ divider circuit.

19. The system as claimed in claim 18, wherein the clock processing circuit is configured to convert the clock input into a low swing sine wave for operation of the CML IQ divider circuit.

20. The system as claimed in claim 19, wherein the clock processing circuit is defined by:
- a discharge time constant higher than a frequency of the clock input;
- an input clock amplitude set higher than a threshold;
- a slope of the clock input controlled at a period approximately equal to a detected self-oscillation period within the second IQ divider, and
- a duty cycle distortion attenuated within the clock input.

* * * * *